United States Patent
Chang et al.

(10) Patent No.: US 12,363,886 B2
(45) Date of Patent: Jul. 15, 2025

(54) SEMICONDUCTOR DEVICE STRUCTURE HAVING A CHANNEL LAYER WITH DIFFERENT ROUGHNESS

(71) Applicant: NANYA TECHNOLOGY CORPORATION, New Taipei (TW)

(72) Inventors: Szu-Yao Chang, New Taipei (TW); Chung-Lin Huang, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 726 days.

(21) Appl. No.: 17/686,858

(22) Filed: Mar. 4, 2022

(65) Prior Publication Data

US 2023/0284435 A1 Sep. 7, 2023

(51) Int. Cl.
*H10B 12/00* (2023.01)
(52) U.S. Cl.
CPC ............................ *H10B 12/312* (2023.02)
(58) Field of Classification Search
CPC ......... H01L 21/32055; H01L 21/76801; H01L 29/78642; H10B 12/05; H10B 12/312; H10B 12/315; H10D 30/6728
See application file for complete search history.

(56) References Cited

U.S. PATENT DOCUMENTS 6,764,884 B1 * 7/2004 Yu ........................ H01L 29/785
438/157
2014/0138768 A1 5/2014 Lee
2018/0069117 A1 3/2018 Cho et al.
2021/0104525 A1 * 4/2021 Tsai ....................... H10B 12/05
2022/0223604 A1 * 7/2022 Park ................... H01L 25/0655

FOREIGN PATENT DOCUMENTS

TW 201421650 A 6/2014
TW 202131451 A 8/2021
TW 202205630 A 2/2022

OTHER PUBLICATIONS

Office Action mailed on Apr. 10, 2023 related to Taiwanese Application No. 111120932.
Office Action mailed on Sep. 13, 2023 related to Taiwanese Application No. 111120931.
Office Action(Restriction Requirement) mailed on Oct. 27, 2023 related to Taiwanese Application No. 111120931.
Office Action and search report mailed on Oct. 1, 2024 related to U.S. Appl. No. 17/653,629.

* cited by examiner

*Primary Examiner* — Britt D Hanley
*Assistant Examiner* — Kevin Quinto
(74) *Attorney, Agent, or Firm* — Xuan Zhang

(57) ABSTRACT

A semiconductor device structure and method for manufacturing the same are provided. The semiconductor device structure includes a first word line, a second word line, a gate dielectric structure, a channel layer, and a bit line. The first word line and second word line extend along a first direction. The gate dielectric structure is disposed on a first sidewall of the first word line and on a second sidewall of the second word line. The channel layer is disposed on a first sidewall of the gate dielectric structure. The bit line is disposed on the channel layer and extends along a second direction substantially perpendicular to the first direction. A first roughness of a first sidewall of the channel is different from a second roughness of a second sidewall of the channel layer.

9 Claims, 21 Drawing Sheets

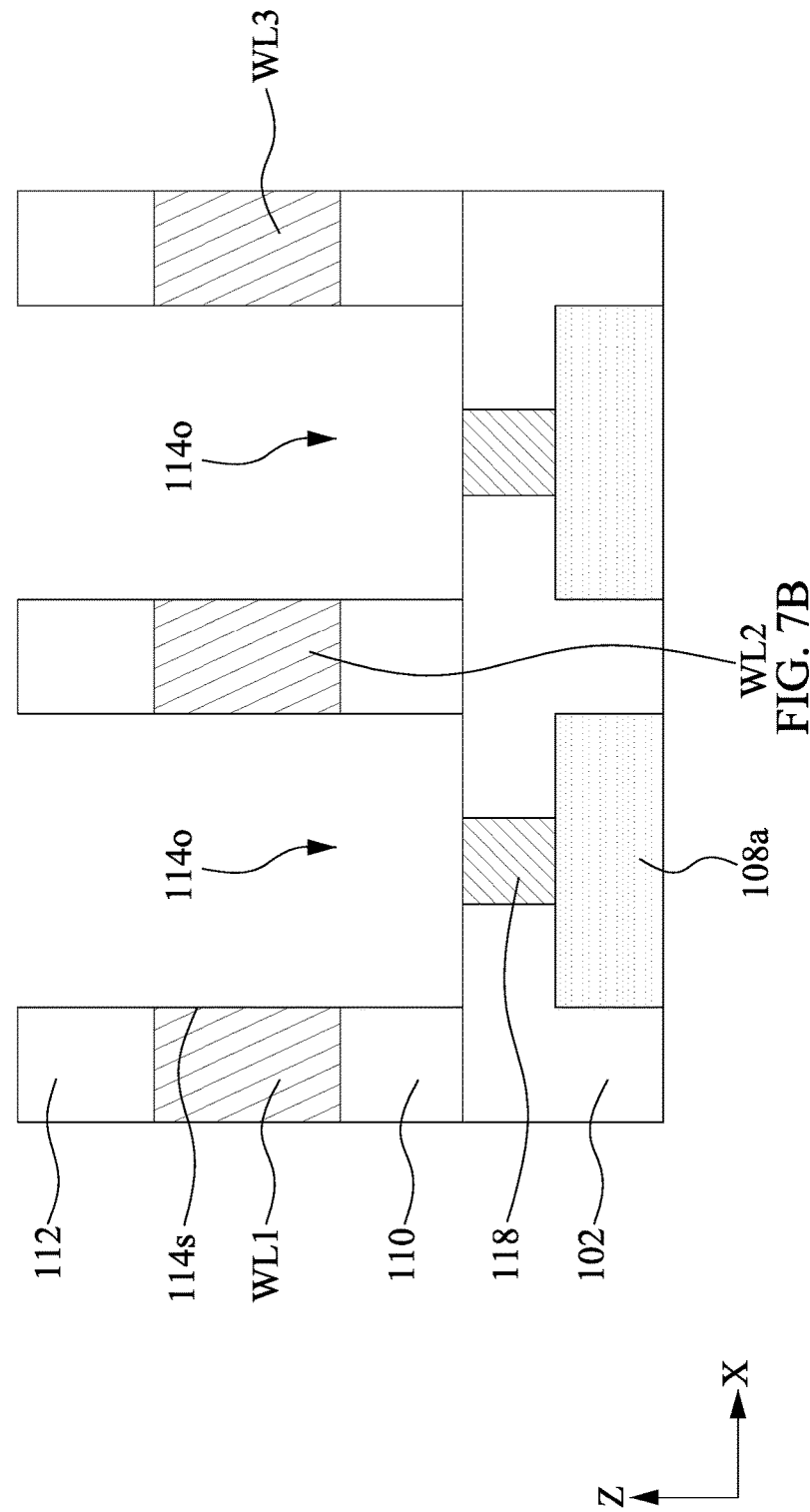

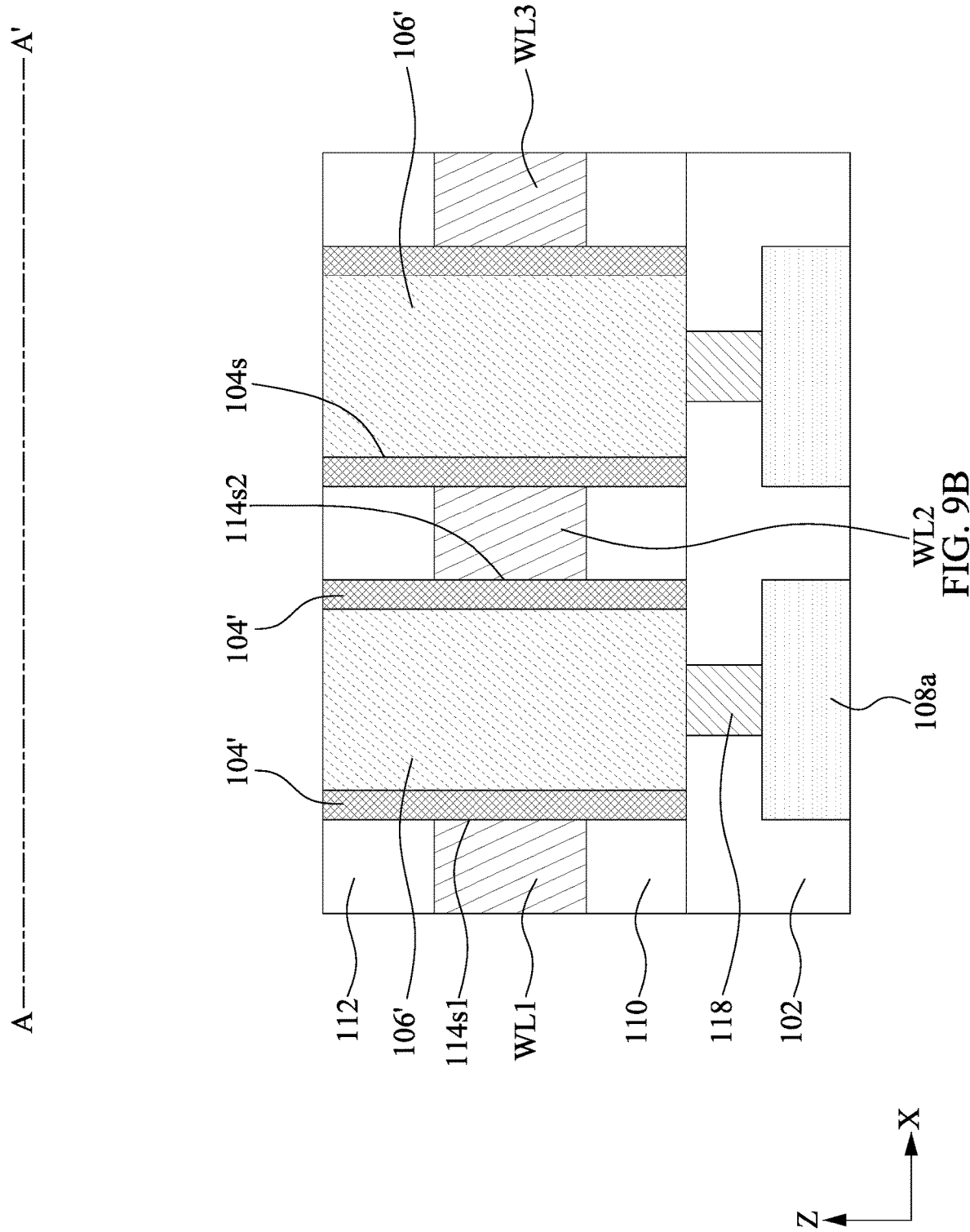

SEMICONDUCTOR DEVICE STRUCTURE HAVING A CHANNEL LAYER WITH DIFFERENT ROUGHNESS

TECHNICAL FIELD

The present disclosure relates to a semiconductor device structure. More specifically, the present disclosure relates to a semiconductor device structure having a channel layer with different roughness at different sidewalls.

DISCUSSION OF THE BACKGROUND

With the rapid growth of the electronics industry, the development of integrated circuits (ICs) has achieved high performance and miniaturization. Technological advances in IC materials and design have produced generations of ICs where each generation has smaller and more complex circuits than the previous generation.

A Dynamic Random Access Memory (DRAM) device is a type of random access memory that stores each bit of data in a separate capacitor within an integrated circuit. Typically, a DRAM is arranged in a square array of one capacitor and transistor per cell. A vertical transistor has been developed for the $4F^2$ DRAM cell, where F stands for the photolithographic minimum feature width or critical dimension (CD). However, recently, DRAM manufacturers face the tremendous challenge of shrinking the memory cell area as the word line spacing continues to shrink. For example, the channel of a bit line is prone to be in contact with a word line, thereby inducing a short due to an overlay error of a lithography process.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a first word line, a second word line, a gate dielectric structure, a channel layer, and a bit line. The first word line and second word line extend along a first direction. The gate dielectric structure is disposed on a first sidewall of the first word line and on a second sidewall of the second word line. The channel layer is disposed on a first sidewall of the gate dielectric structure. The bit line is disposed on the channel layer and extends along a second direction substantially perpendicular to the first direction. The channel layer has a first sidewall extending along the first direction and a second sidewall extending along the second direction. The first sidewall of the channel layer has a first roughness. The second sidewall of the channel layer has a second roughness different from the first roughness of the channel layer.

Another aspect of the present disclosure provides another semiconductor device structure. The semiconductor device structure includes a first word line, a second word line, a gate dielectric structure, a channel layer, and a bit line. The first word line extends along a first direction. The second word line is physically separated from the first word line and extends along the first direction. The gate dielectric structure is disposed between the first word line and the second word line. The channel layer is surrounded by the gate dielectric structure. The bit line is disposed on the channel layer and extends along a second direction substantially perpendicular to the first direction.

Another aspect of the present disclosure provides a method for manufacturing a semiconductor device structure. The method includes: providing a substrate; forming a first word line and a second word line extending along a first direction; forming a dielectric material conformally on a first sidewall of the first word line and on a second sidewall of the second word line, wherein the second sidewall of the second word line faces the first sidewall of the first word line; forming a semiconductor material on a sidewall of the dielectric material; and patterning the dielectric material and the semiconductor material to form a gate dielectric structure and a channel layer between the first word line and the second word line.

The embodiments of the present disclosure provide a semiconductor device structure with a channel layer including a rectangular profile or a square profile in a top view. The channel layer is disposed between two separated word lines. Thus, a lithography process performed on the word line, which is utilized to form opening to be filled with a gate dielectric structure and a channel layer, can be omitted. Further, the thickness of the channel layer and the gate dielectric structure can be adjusted more flexibly. Accordingly, the yield and performance of a semiconductor device structure can be improved.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 6B, FIG. 7B, FIG. 8B, FIG. 9B, FIG. 10B, FIG. 11B and FIG. 12B are cross-sectional views along line A-A' of FIG. 6A, FIG. 7A, FIG. 8A, FIG. 9A, FIG. 10A, FIG. 11A and FIG. 12A, respectively.

DETAILED DESCRIPTION

Figure 1A:
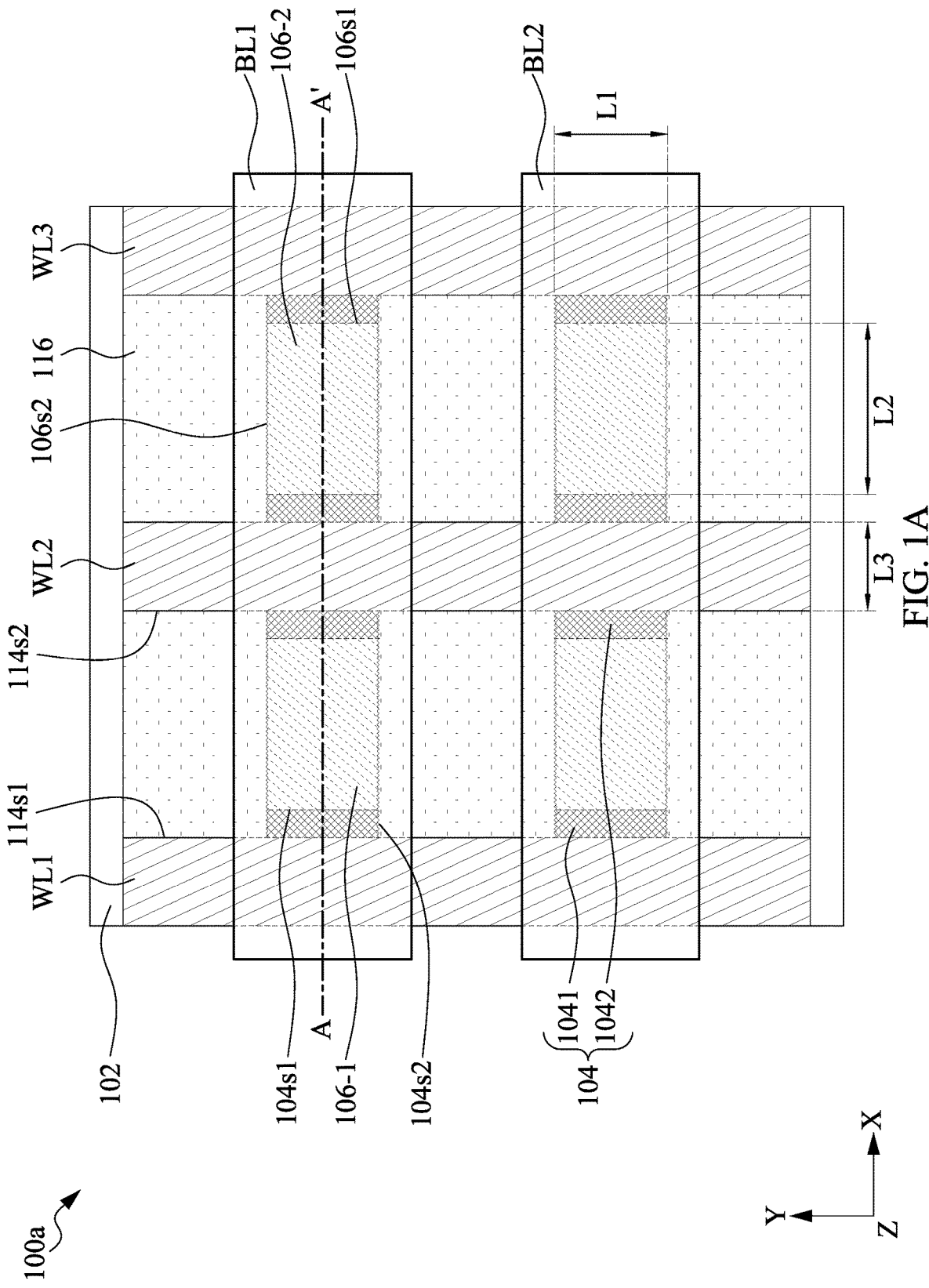
FIG. 1A is a top view of a layout of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1A is a top view of a layout of a semiconductor device structure 100a, in accordance with some embodiments of the present disclosure.

The semiconductor device structure 100a can include a memory, memory device, memory die, memory chip or other components. The semiconductor device structure 100a can be a portion of memory, memory device, memory die, or memory chip. For example, the memory can be a dynamic random access memory (DRAM). In some embodiments, the DRAM can be a double data rate fourth generation (DDR4) DRAM. In some embodiments, the memory includes one or more memory cells (or memory bits, memory blocks).

As shown in FIG. 1A, the semiconductor device structure 100a can include a substrate 102, a plurality of word lines WL1, WL2, and WL3, a plurality of bit lines BL1 and BL2, a gate dielectric structure 104, channel layers 106-1 and 106-2, as well as a dielectric layer 116.

Each of the word lines WL1, WL2, and WL3 can extend along the Y-axis. Each of the word lines WL1, WL2, and WL3 can be parallel to each other. In some embodiments, each of the word lines WL1, WL2, and WL3 can be physically separated from each other. The word lines WL1, WL2, and WL3 can include conductive materials, such as tungsten (W), copper (Cu), aluminum (Al), tantalum (Ta), molybdenum (Mo), tantalum nitride (TaN), titanium, titanium nitride (TiN), the like, and/or a combination thereof.

Each of the bit lines BL1 and BL2 can extend along the X-axis. Each of the bit lines BL1 and BL2 can be parallel to each other. Each of the bit lines BL1 and BL2 can be physically separated from each other. In some embodiments, the bit lines BL1 and BL2 can be located at a horizontal level higher than that of the word lines WL1, WL2, and WL3. The bit lines BL1 and BL2 can include conductive materials, such as tungsten, copper, aluminum, tantalum, tantalum nitride, titanium, titanium nitride, the like, and/or a combination thereof.

In some embodiments, the gate dielectric structure 104 can be disposed on a sidewall of the word line. In some embodiments, the gate dielectric structure 104 can be disposed on a sidewall 114s1 of the word line WL1. In some embodiments, the gate dielectric structure 104 can be disposed on a sidewall 114s2 of the word line WL2. In some embodiments, the gate dielectric structure 104 can be disposed between two adjacent word lines. For example, the gate dielectric structure 104 can be disposed between word lines WL1 and WL2. In some embodiments, the gate dielectric structure 104 can overlap the bit line BL1 or BL2 along the Z-axis. In some embodiments, the gate dielectric structure 104 can include silicon oxide ($SiO_x$), silicon nitride ($Si_xN_y$), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the gate dielectric structure 104 can have a sidewall 104s1 and a sidewall 104s2. The sidewall 104s1 of the gate dielectric structure 104 can be spaced apart from the word line WL1. The sidewall 104s2 of the gate dielectric structure 104 can extend between the word line WL1 and the sidewall 104s1 of the gate dielectric structure 104. The sidewall 104s1 of the gate dielectric structure 104 can extend along the Y-axis. The sidewall 104s2 of the gate dielectric structure 104 can extend along the X-axis. In some embodiments, the length of the sidewall 104s1 of the gate dielectric structure 104 can be different from that of the sidewall 104s2 of the gate dielectric structure 104. In some embodiments, the length of the sidewall 104s1 of the gate dielectric structure 104 can exceed that of the sidewall 104s2 of the gate dielectric structure 104.

In some embodiments, the roughness of the sidewall 104s1 of the gate dielectric structure 104 can be different from the roughness of the sidewall 104s2 of the gate dielectric structure 104. In some embodiments, the roughness of the sidewall 104s1 of the gate dielectric structure 104 is less than the roughness of the sidewall 104s2 of the gate dielectric structure 104. In some embodiments, the sidewall 104s1 of the gate dielectric structure 104 can overlap the word line WL1, WL2, or WL3 along the X-axis. In some embodiments, the sidewall 104s2 of the gate dielectric structure 104 can be free from overlapping the word line WL1, WL2, or WL3 along the Y-axis. In some embodiments, the sidewall 104s2 of the gate dielectric structure 104 can be exposed from the word line WL1, WL2, or WL3.

In some embodiments, the gate dielectric structure 104 can include a part 1041 and a part 1042 physically separated from the part 1041. In some embodiments, the part 1041 can be disposed on the sidewall 114s1 of the word line WL1. The part 1042 can be disposed on the sidewall 114s2 of the word line WL2. In some embodiments, one of the part 1041 and part 1042 can be replaced by other dielectric materials different from the gate dielectric structure 104. In some embodiments, one of the part 1041 and part 1042 can be omitted.

In some embodiments, each of the channel layers 106-1 and 106-2 can be disposed between two adjacent word lines. For example, the channel layer 106-1 can be disposed between the word lines WL1 and WL2. The channel layer 106-2 can be disposed between the word lines WL2 and WL3. In some embodiments, each of the channel layers 106-1 and 106-2 can be disposed on the sidewall 104s1 of the gate dielectric structure 104. In some embodiments, the channel layer 106-1 or 106-2 can be disposed between the parts 1041 and 1042 of the gate structure 104. In some embodiments, each of the channel layers 106-1 and 106-2 can be in contact with the gate dielectric structure 104. In some embodiments, each of the channel layers 106-1 and 106-2 can overlap the bit line BL1 or BL2 along the Z-axis.

The material of the channel layers 106-1 and 106-2 can include an amorphous semiconductor, a poly-semiconductor and/or metal oxide. The semiconductor can include, but is not limited to, germanium (Ge), silicon (Si), tin (Sn), antimony (Sb). The metal oxide may include, but is not limited to, indium oxide; tin oxide; zinc oxide; a two-component metal oxide such as an In—Zn-based oxide, a Sn Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also represented as IGZO), an In—Al—Zn-based oxide, an In Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide, but the present disclosure is not limited in this regard.

In some embodiments, each of the channel layers 106-1 and 106-2 can be surrounded by the gate dielectric structure 104. In some embodiments, each of the channel layers 106-1 and 106-2 can be partially surrounded by the gate dielectric structure 104.

In some embodiments, each of the channel layers 106-1 and 106-2 can include a sidewall 106s1 and a sidewall 106s2. The sidewall 106s1 of the channel layer 106-1 or 106-2 can extend along the Y-axis. The sidewall 106s1 of the channel layer 106-1 or 106-2 can be in contact with the gate dielectric structure 104. The sidewall 106s2 of the channel layer 106-1 or 106-2 can extend along the X-axis. In some embodiments, the sidewall 106s2 of the channel layer 106-1 or 106-2 can extend between parts 1041 and 1043 of the gate dielectric structure 104.

In some embodiments, the sidewall 106s1 of the channel layer 106-1 or 106-2 can overlap the word line WL1, WL2, or WL3 along the X-axis. In some embodiments, the sidewall 106s2 of the channel layer 106-1 or 106-2 can be free from overlapping the word line WL1, WL2, or WL3 along the Y-axis. In some embodiments, the sidewall 106s2 of the channel layer 106-1 or 106-2 can be exposed from the word line WL1, WL2, or WL3. In some embodiments, the sidewall 106s1 of the channel layer 106-1 or 106-2 can overlap the gate dielectric structure 104 along the X-axis. In some embodiments, the sidewall 106s2 of the channel layer 106-1 or 106-2 can be free from overlapping the gate dielectric structure 104 along the Y-axis. In some embodiments, the sidewall 106s2 of the channel layer 106-1 or 106-2 can be exposed from the gate dielectric structure 104. In some embodiments, the sidewall 106s2 of the channel layer 106-1 or 106-2 can be coplanar with the sidewall 104s2 of the gate dielectric structure 104.

Each of the channel layers 106-1 and 106-2 can have a length L1 along the Y-axis. Each of the channel layers 106-1 and 106-2 can have a length L2 along the X-axis. In some embodiments, the length L1 can be different from the length L2. In some embodiments, the length L1 can be less than the length L2. In other embodiments, the length L1 can exceed the length L2. Each of the word lines WL1, WL2, and WL3 can have a length L3 along the X-axis. In some embodiments, the length L2 can exceed the length L3. In other embodiments, the length L3 can exceed the length L2. In some embodiments, the channel layers 106-1 or 106-2 can be spaced apart from the word line WL1, WL2, or WL3 by the gate dielectric structure 104. In some embodiments, each of the channel layers 106-1 and 106-2 can have a rectangular profile, a square profile, or other suitable profiles in a top view.

In some embodiments, the dielectric layer 116 can be disposed on the sidewall of the word line. For example, the dielectric layer 116 can be disposed on the sidewall 114s1 of the word line WL1. The dielectric layer 116 can be disposed on the sidewall 114s2 of the word line WL2. In some embodiments, the dielectric layer 116 can be disposed between the two adjacent word lines. For example, the dielectric layer 116 can be disposed between the word lines WL1 and WL2. In some embodiments, the sidewall 104s2 of the gate dielectric structure 104 can be in contact with the dielectric layer 116. In some embodiments, the sidewall 106s2 of the channel layer 106-1 or 106-2 can be in contact with the dielectric layer 116. The dielectric layer 116 can include silicon oxide ($SiO_x$), silicon nitride ($Si_xN_y$), silicon oxynitride (SiON), or other suitable materials. The material of the dielectric layer 116 can be different from that of the gate dielectric structure 104.

Figure 1B:
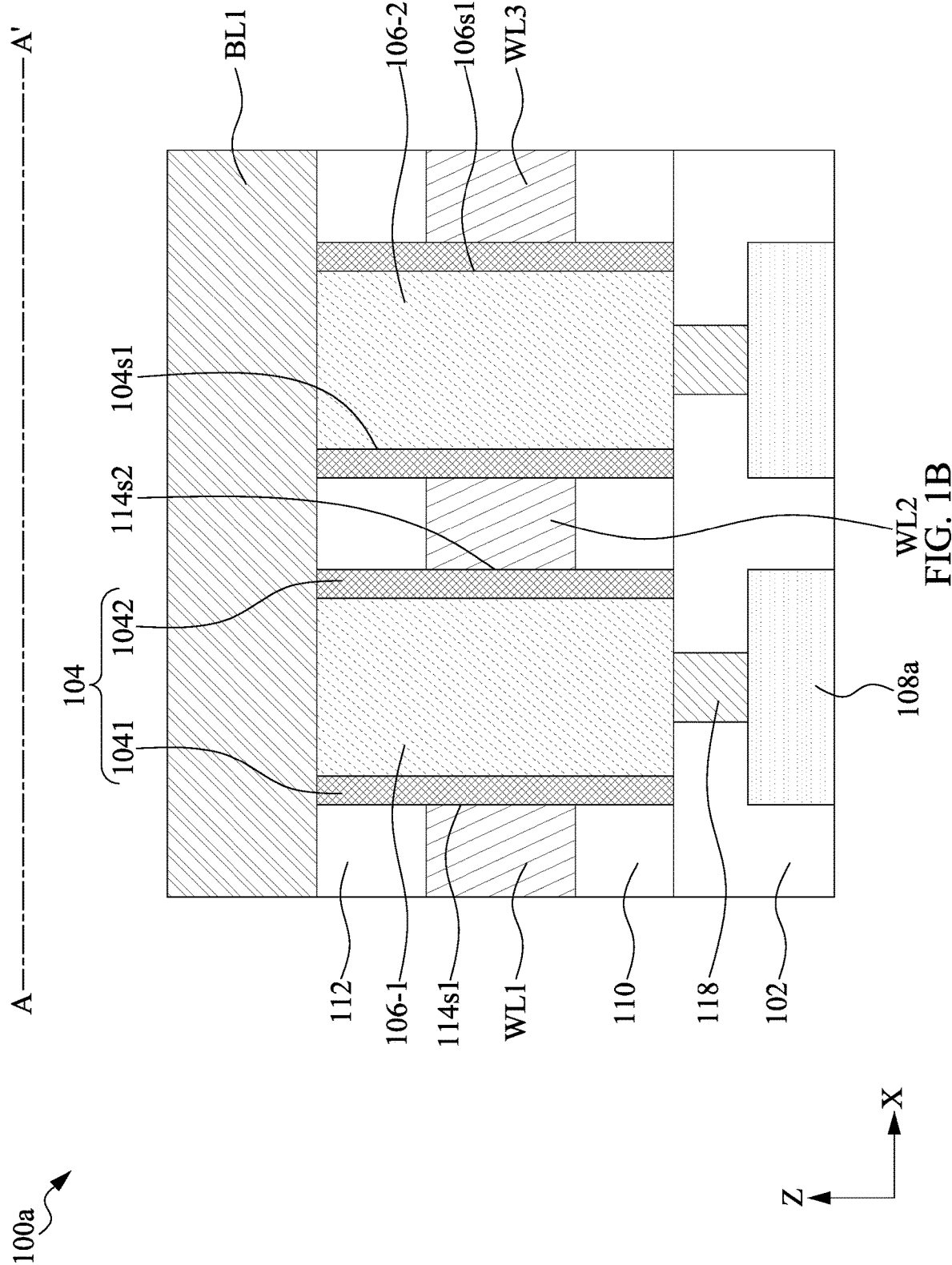
FIG. 1B is a cross-sectional view along line A-A' of the semiconductor device structure as shown in FIG. 1A, in accordance with some embodiments of the present disclosure.

FIG. 1B is a cross-sectional view along line A-A' of the semiconductor device structure 100a as shown in FIG. 1A, in accordance with some embodiments of the present disclosure.

As shown in FIG. 1B, the semiconductor device structure 100a can further include a capacitor structure 108a, a dielectric layer 110, a dielectric layer 112, and a contact plug 118.

The substrate 102 may be a semiconductor substrate, such as a bulk semiconductor, a semiconductor-on-insulator (SOI) substrate, or the like. The substrate 102 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 102 may have a multilayer structure, or the substrate 102 may include a multilayer compound semiconductor structure.

Although not shown in FIG. 1B, it should be noted that the substrate 102 can include isolation structures disposed therein. The isolation structures can include shallow trench isolation (STI), a field oxide (FOX), a local-oxidation of silicon (LOCOS) feature, and/or other suitable isolation elements. The isolation structure can include a dielectric material such as silicon oxide, silicon nitride, silicon oxynitride, fluoride-doped silicate (FSG), a low-k dielectric material, combinations thereof, and/or other suitable materials. Further, the substrate 102 can have multiple doped regions therein. In some embodiments, p type and/or n type dopants can be doped in the substrate 102. In some embodiments, p type dopants include boron (B), other group III elements, or any combination thereof. In some embodiments, n type dopants include arsenic (As), phosphorus (P), other group V elements, or any combination thereof.

In some embodiments, the capacitor structure 108a can be disposed within the substrate 102. In some embodiments, the capacitor structure 108a can include two electrodes and one insulation layer therebetween. The electrode can include a conductive material, such as tungsten, copper, aluminum, tantalum, or other suitable materials. The insulation layer can include silicon oxide, tungsten oxide, copper oxide, aluminum oxide, hafnium oxide, or the like. In some embodiments, the capacitor structure 108a can include a metal-insulator-metal (MIM) structure. In some embodiments, two electrodes of the capacitor structure 108a can be arranged along the X-axis. In some embodiments, two electrodes of the capacitor structure 108a can be arranged along the Z-axis.

In some embodiments, the contact plug 118 can be disposed on the capacitor structure 108a. In some embodiments, the contact plug 118 can be disposed within the substrate 102. The contact plug 118 can include a conductive material, such as tungsten, copper, aluminum, tantalum, or other suitable materials. In some embodiments, the contact plug 118 can be utilized to electrically connect the capacitor structure 108a and bit line BL1 or BL2. In some embodiments, the contact plug 118 can be utilized to electrically connect the capacitor structure 108a and word line WL1, WL2, or WL3. In some embodiments, a doped region (not shown) can be disposed between the contact plug 118 and the channel layer 106-1 or 106-2.

The dielectric layer 110 can be disposed on the substrate 102. The dielectric layer 110 can include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the word lines WL1, WL2, and WL3 can be disposed on the dielectric layer 110.

The dielectric layer 112 can be disposed on the word lines WL1, WL2, and WL3. The dielectric layer 112 can include silicon oxide ($SiO_x$), silicon nitride ($Si_xN_y$), silicon oxynitride (SiON), phosphosilicate glass (PSG), borophosphosilicate glass (BPSG), a low-k dielectric material (k<4), or other suitable materials. In some embodiments, the bit lines (e.g., BL1) can be disposed on the dielectric layer 112.

In some embodiments, the gate dielectric structure 104 can penetrate the dielectric layer 112. In some embodiments, the gate dielectric structure 104 can penetrate the dielectric layer 110. In some embodiments, each of the channel layers 106-1 and 106-2 can penetrate the dielectric layer 112. In some embodiments, each of the channel layers 106-1 and 106-2 can penetrate the dielectric layer 110.

In some embodiments, the sidewall 104s1 of the gate dielectric structure 104 can be perpendicular to the upper surface of the substrate 102. The gate dielectric structure 104 can extend between the substrate 102 and the bit line (e.g., BL1). In some embodiments, the sidewall 106s1 of the channel layers 106-1 and 106-2 can be perpendicular to the upper surface of the substrate 102. Each of the channel layers 106-1 and 106-2 can extend between the substrate 102 and the bit line (e.g., BL1).

In some embodiments, a word line (e.g., WL1, WL2, or WL3), a gate dielectric structure 104, and a channel layer 106-1 or 106-2 can be included in a transistor. During a read operation, a word line (e.g., WL1, WL2 or WL3) can be asserted, turning on a transistor. The enabled transistor allows the voltage across a capacitor (e.g., capacitor structure 108a) to be read by a sense amplifier through a bit line (e.g., BL1 or BL2). During a write operation, the data to be written can be provided on the bit line (e.g., BL1 or BL2) when the word line (e.g., WL1, WL2 or WL3) is asserted.

In comparison with a comparative semiconductor device structure, the gate dielectric layer and/or the channel layer is formed within a word line. A center portion of the word line is removed by a lithography process. Next, a dielectric material and a semiconductor material are filled into openings defined by the word line, thereby forming a gate dielectric structure and a channel layer. In some situations, when the lithography process has a relatively great overlay error, the boundary of the word line may be removed, causing the deposited channel layer to exceed the boundary of the word line. As a result, when an external voltage is imposed on the word line, the bit line may not respond to electrical signals of the word line. In this embodiment, each of the channel layers 106-1 and 106-2 is formed between two separated word lines. A lithography process performed on the word line, which is utilized to form an opening to be filled with the gate dielectric structure and channel layer, can be omitted. Further, the thickness of the gate dielectric structure 104, channel layers 106-1 and 106-2 can be adjusted more flexibly. Accordingly, the yield and performance of the semiconductor device structure 100a can be improved.

Figure 2:
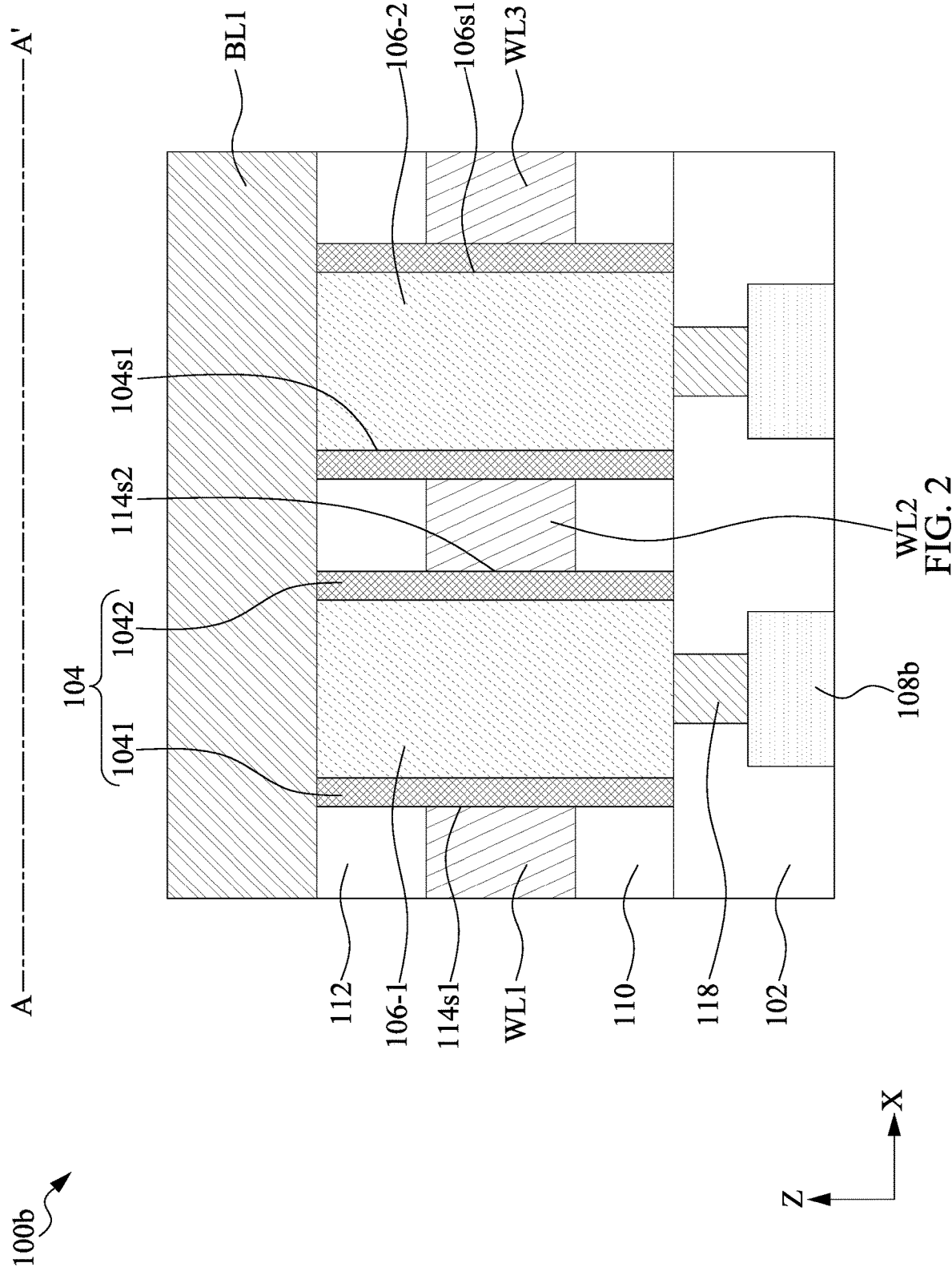
FIG. 2 is a cross-sectional view of a semiconductor device structure, in accordance with some embodiments of the present disclosure.

FIG. 2 is a cross-sectional view of a semiconductor device structure 100b, in accordance with some embodiments of the present disclosure. The semiconductor device structure 100b shown in FIG. 2 can be similar to the semiconductor device structure 100a shown in FIG. 1B, differing in that the semiconductor device structure 100b can include a capacitor structure 108b replacing the capacitor structure 108a.

In some embodiments, the capacitor structure 108b can be free from overlapping the word lines WL1, WL2, and WL3 along the Z-axis. In some embodiments, the capacitor structure 108b can be free from overlapping the gate dielectric structure 104. In some embodiments, the contact plug 118 can be free from overlapping the word lines WL1, WL2, and WL3 along the Z-axis. In comparison with a comparative semiconductor device structure, the contact plug 118 can have a longer distance from the word line WL1, WL2, or WL3. Thus, electrical shorts can be prevented when a high external voltage is imposed on the word line WL1, WL2, or WL3.

Figure 3:
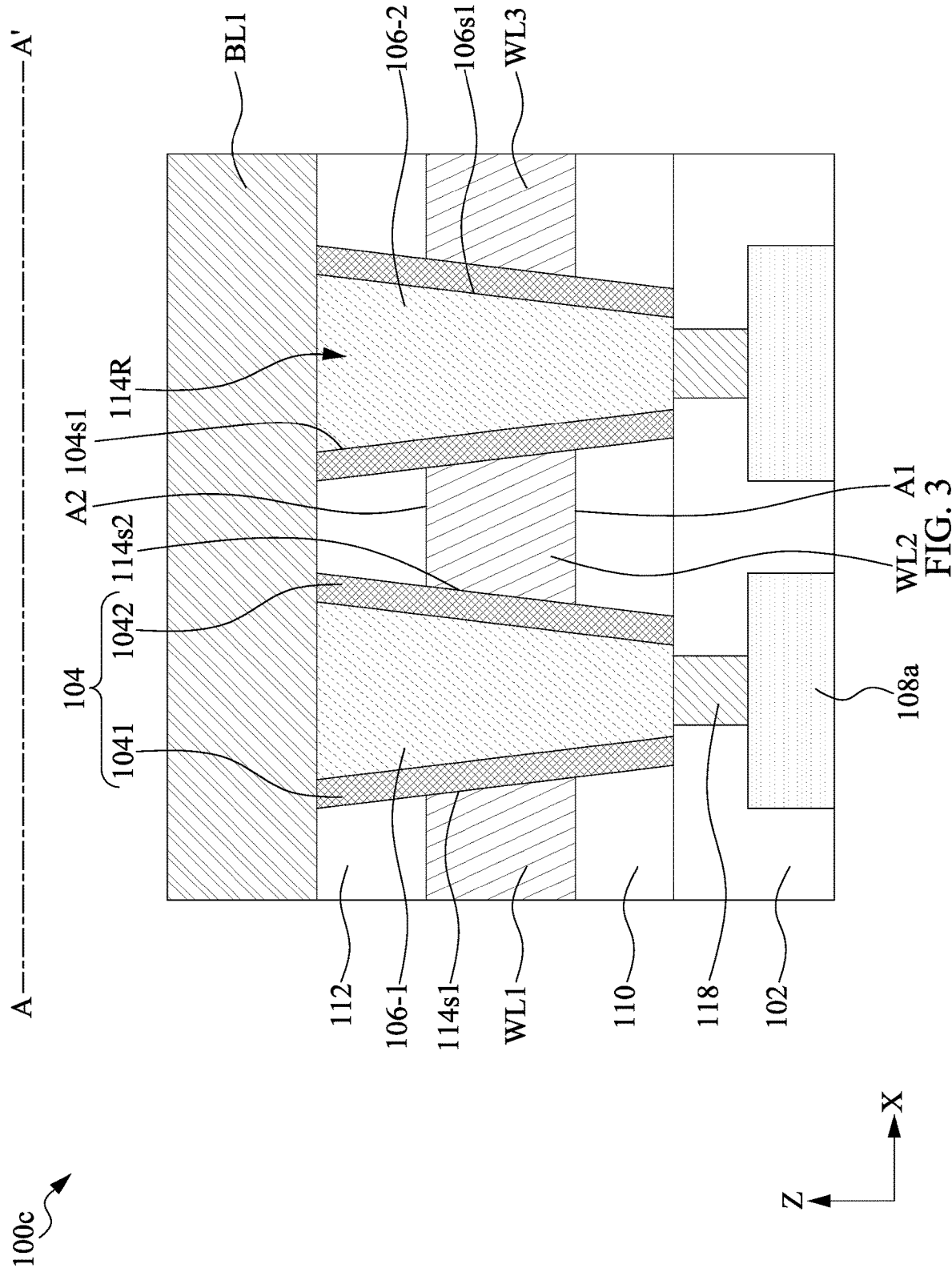
FIG. 3 is a cross-sectional view of a semiconductor device structure, in accordance with some embodiments of the present disclosure.

FIG. 3 is a cross-sectional view of a semiconductor device structure 100c, in accordance with some embodiments of the present disclosure. The semiconductor device structure 100c shown in FIG. 3 can be similar to the semiconductor device structure 100a shown in FIG. 1B, differing in that the semiconductor device structure 100c can have a recess 114R defined by the word lines, dielectric layers 110 and 112.

In some embodiments, the recess 114R can be tapered from the bit line (e.g., BL1) toward the substrate 102. In some embodiments, the sidewall of the gate dielectric structure 104 can be slanted with respect to the upper surface of the substrate 102. In some embodiments, the sidewall of the channel layer 106-1 can be slanted with respect to the upper surface of the substrate 102. The lower surface of the word line (e.g., WL2) can have a surface area A1. The upper surface of the word line (e.g., WL2) can have a surface area A2. In some embodiments, the surface area A1 can exceed the surface area A2.

In some embodiments, each of the channel layers 106-1 and 106-2 can be tapered from the bit line BL1 toward the substrate 102.

Figure 4A:
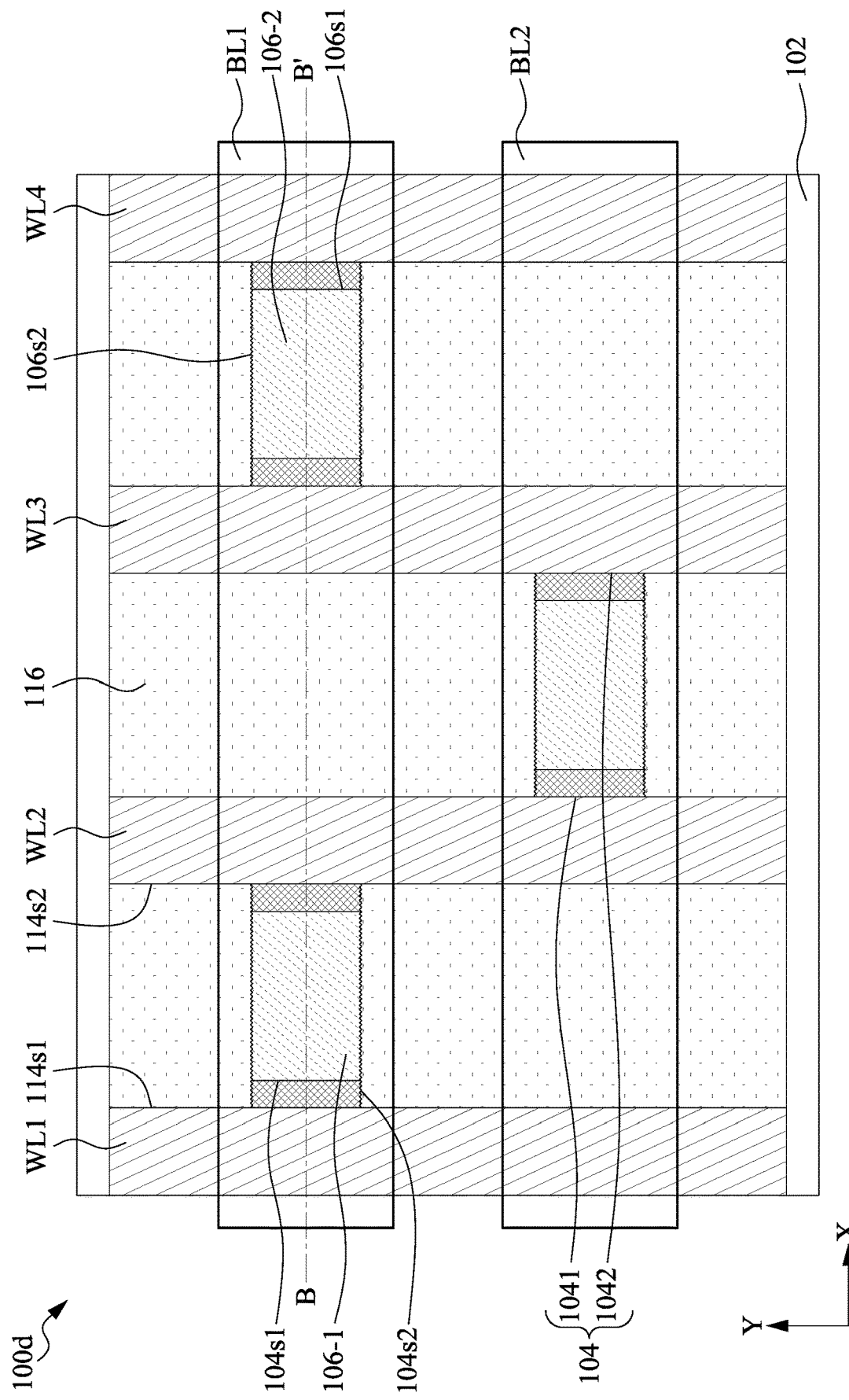
FIG. 4A is a top view of a layout of a semiconductor device structure, in accordance with some embodiments of the present disclosure.
Figure 4B:
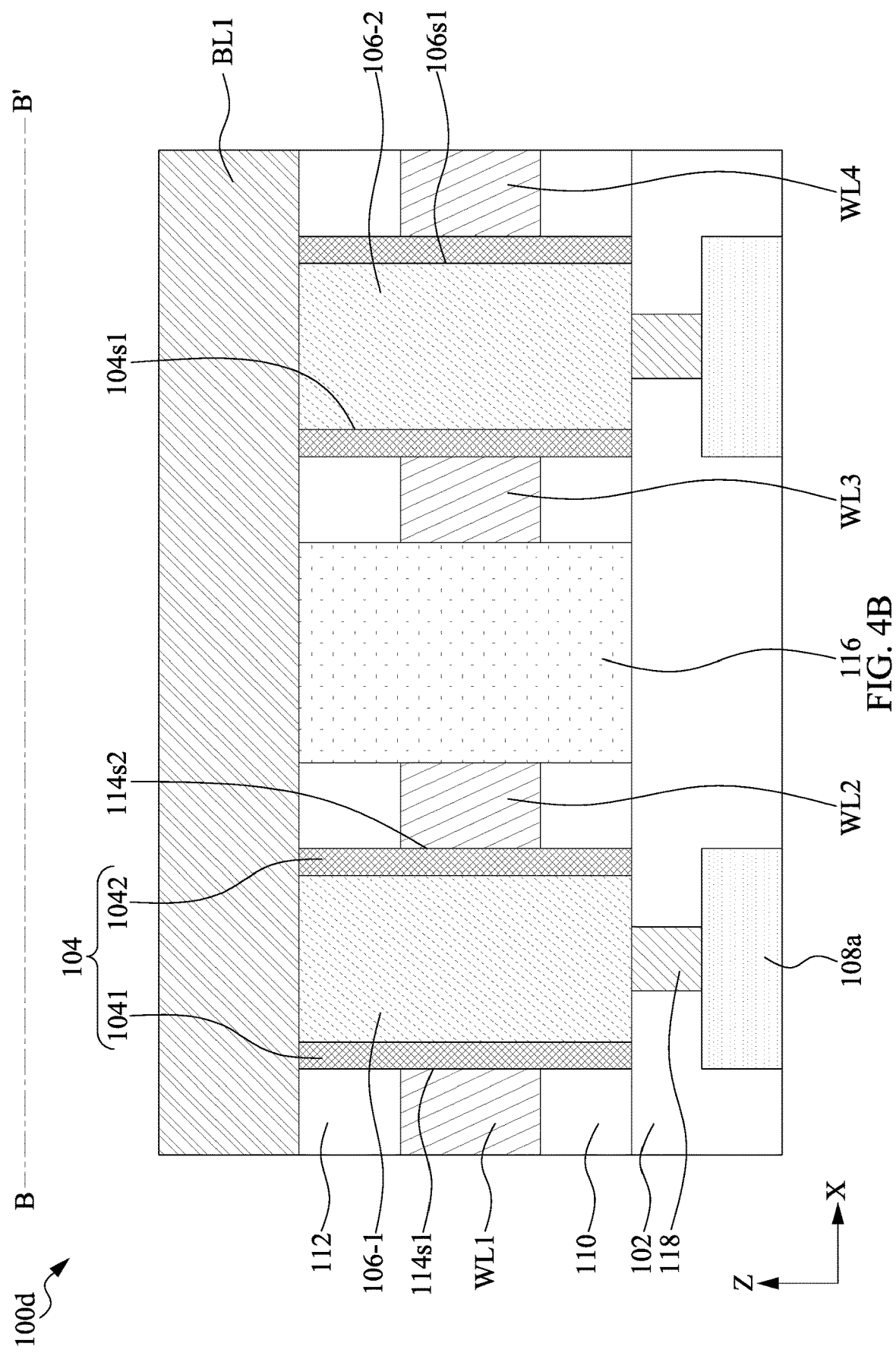
FIG. 4B is a cross-sectional view along line B-B' of the semiconductor device structure as shown in FIG. 4A, in accordance with some embodiments of the present disclosure.

FIG. 4A is a top view of a layout of a semiconductor device structure 100d, in accordance with some embodiments of the present disclosure. FIG. 4B is a cross-sectional view along line B-B' of the semiconductor device structure 100d as shown in FIG. 4A. The semiconductor device structure 100d shown in FIG. 4A and FIG. 4B can be similar to the semiconductor device structure 100a shown in FIG. 1A and FIG. 1B, differing in that the semiconductor device structure 100d can further include a word line WL4.

In some embodiments, the channel layer 106-2 can be disposed between the word lines WL3 and WL4. As shown in FIG. 4A and FIG. 4B, the channel layer 106-1 can be separated from the channel layer 106-2 further by the dielectric layer 116 along the X-axis. In some embodiments, a portion of the dielectric layer 116 can be disposed between the channel layers 106-1 and 106-2 along the X-axis.

Figure 5:
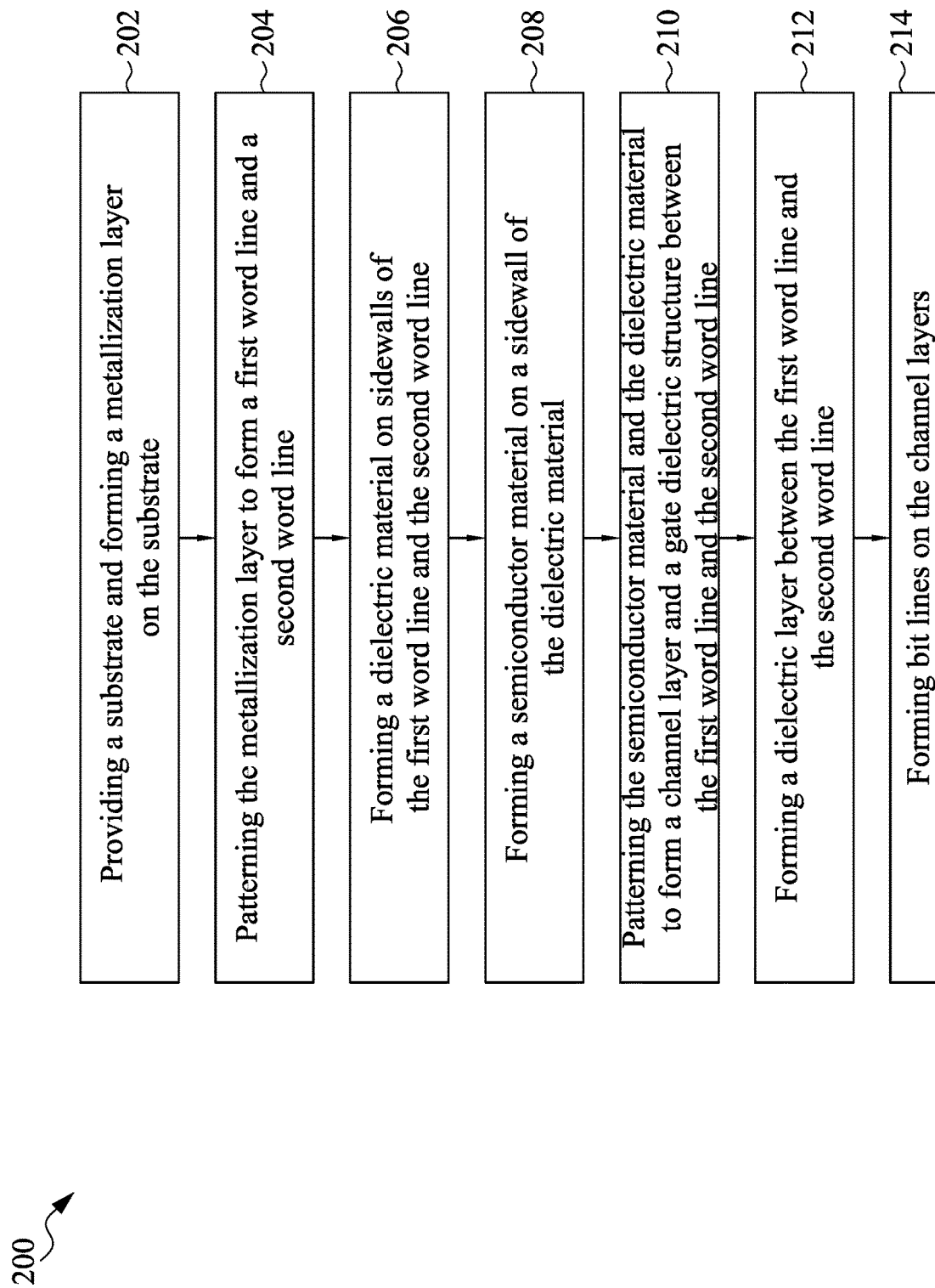
FIG. 5 is a schematic chart illustrating a method of manufacturing a semiconductor device structure, in accordance with some embodiments of the present disclosure.

FIG. 5 is a schematic chart illustrating a method 200 of manufacturing a semiconductor device structure, in accordance with some embodiments of the present disclosure.

The method 200 begins with operation 202 in which a substrate is provided. A first dielectric layer can be formed on the substrate. A metallization layer can be formed on the substrate. The metallization layer can be separated from the substrate by the first dielectric layer. A second dielectric layer can be formed on the metallization layer.

The method 200 continues with operation 204 in which the metallization layer is patterned. An etching process can be performed to etch a portion of the first dielectric layer, the metallization layer, and the second dielectric layer. As a result, a first word line and a second word line can be formed. Further, an opening can be formed between the first word line and the second word line.

The method 200 continues with operation 206 in which a dielectric material can be formed on sidewalls of the first word line and the second word line. The dielectric material can be conformally formed on the sidewalls of the first dielectric layer, the second dielectric layer, the first word line and the second word line.

The method 200 continues with operation 208 in which a semiconductor material can be formed on a sidewall of the dielectric material. In some embodiments, the semiconductor material can fill the opening between the first word line and the second word line.

The method 200 continues with operation 210 in which the semiconductor material and the dielectric material can be patterned. Thus, a gate dielectric structure and a channel layer can be formed between the first word line and the second word line. In some embodiments, after the dielectric material is patterned, a sidewall of the gate dielectric structure is exposed by the first word line and the second word line. In some embodiments, after the semiconductor material is patterned, a sidewall of the channel layer is exposed by the first word line and the second word line. In some embodiments, after the semiconductor material is patterned, the channel layer can have a rectangular profile or a square profile. In some embodiments, the semiconductor material and the dielectric material can be patterned by the same operation and/or equipment. In some embodiments, the semiconductor material and the dielectric material can be patterned simultaneously. For example, the semiconductor material and the dielectric material can be patterned by the same equipment performing the same processes.

The method 200 continues with operation 212 in which a third dielectric layer can be formed between the first word line and the second word line. In some embodiments, the third dielectric layer can be in contact with exposed sidewalls of the gate dielectric structure and the channel layer.

The method 200 continues with operation 214 in which a bit line can be formed on the channel layer. As a result, a semiconductor device structure can be produced.

The method 200 is merely an example, and is not intended to limit the present disclosure beyond what is explicitly recited in the claims. Additional operations can be provided before, during, or after each operation of the method 200, and some operations described can be replaced, eliminated, or moved around for additional embodiments of the method. In some embodiments, the method 200 can include further operations not depicted in FIG. 5. In some embodiments, the method 200 can include one or more operations depicted in FIG. 5.

FIG. 6A, FIG. 7A, FIG. 8A, FIG. 9A, FIG. 10A, FIG. 11A and FIG. 12A illustrate one or more stages of an example of a method for manufacturing a semiconductor device structure 100a according to some embodiments of the present disclosure. FIG. 6B, FIG. 7B, FIG. 8B, FIG. 9B, FIG. 10B, FIG. 11B and FIG. 12B are cross-sectional views along line A-A' of FIG. 6A, FIG. 7A, FIG. 8A, FIG. 9A, FIG. 10A, FIG. 11A and FIG. 12A, respectively. It should be noted that some elements are illustrated in cross-sectional views but not in top views for brevity.

Figure 6A:
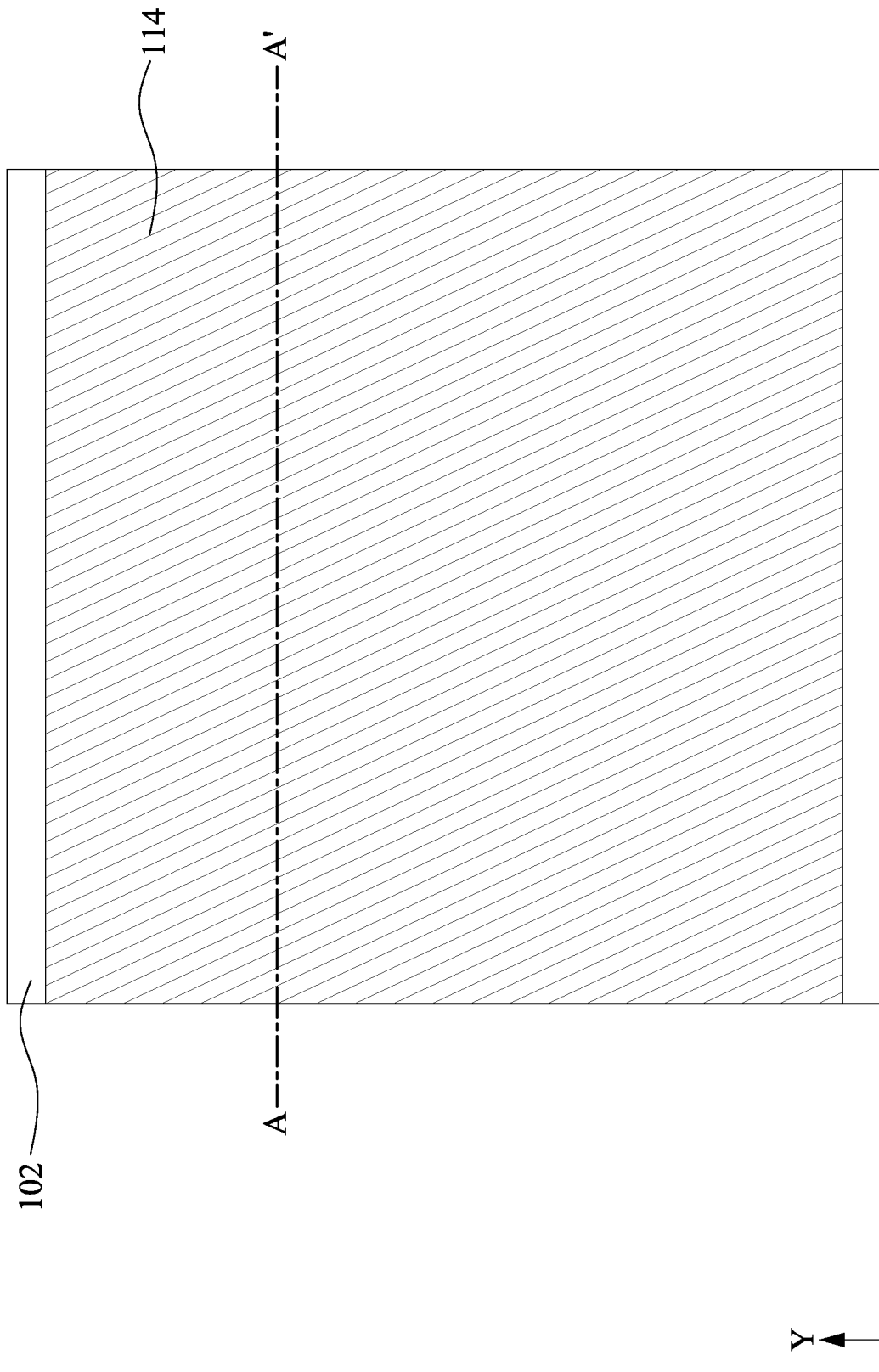
FIG. 6A, FIG. 7A, FIG. 8A, FIG. 9A, FIG. 10A, FIG. 11A and FIG. 12A illustrate one or more stages of an example of a method for manufacturing a semiconductor device structure according to some embodiments of the present disclosure.
Figure 6B:
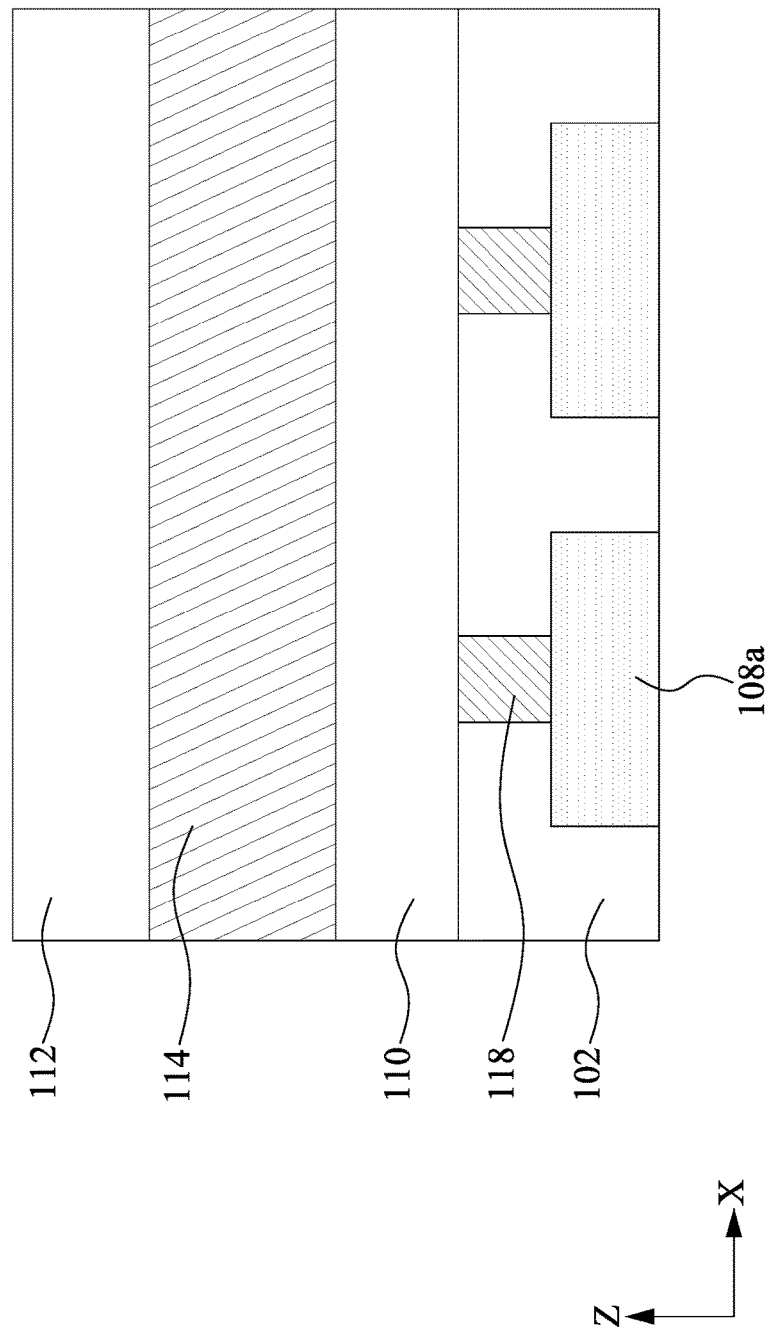

As shown in FIG. 6A and FIG. 6B, a substrate 102 can be provided. In some embodiments, a capacitor structure 108a can be formed within the substrate 102. In some embodiments, a contact plug 118 can be formed within the substrate 102. In some embodiments, the contact plug 118 can be formed on the capacitor structure 108. In some embodiments, a dielectric layer 110 can be formed on the substrate 102. In some embodiments, a metallization layer 114 can be formed on the dielectric layer 110. In some embodiments, a dielectric layer 112 can be formed on the metallization layer 114. The dielectric layer 110 and dielectric layer 112 can be formed by chemical vapor deposition (CVD), atomic layer deposition (ALD), physical vapor deposition (PVD), low-pressure chemical vapor deposition (LPCVD), or other suitable processes. The metallization layer 114 can be formed by sputtering, PVD, or other suitable processes.

Figure 7A:
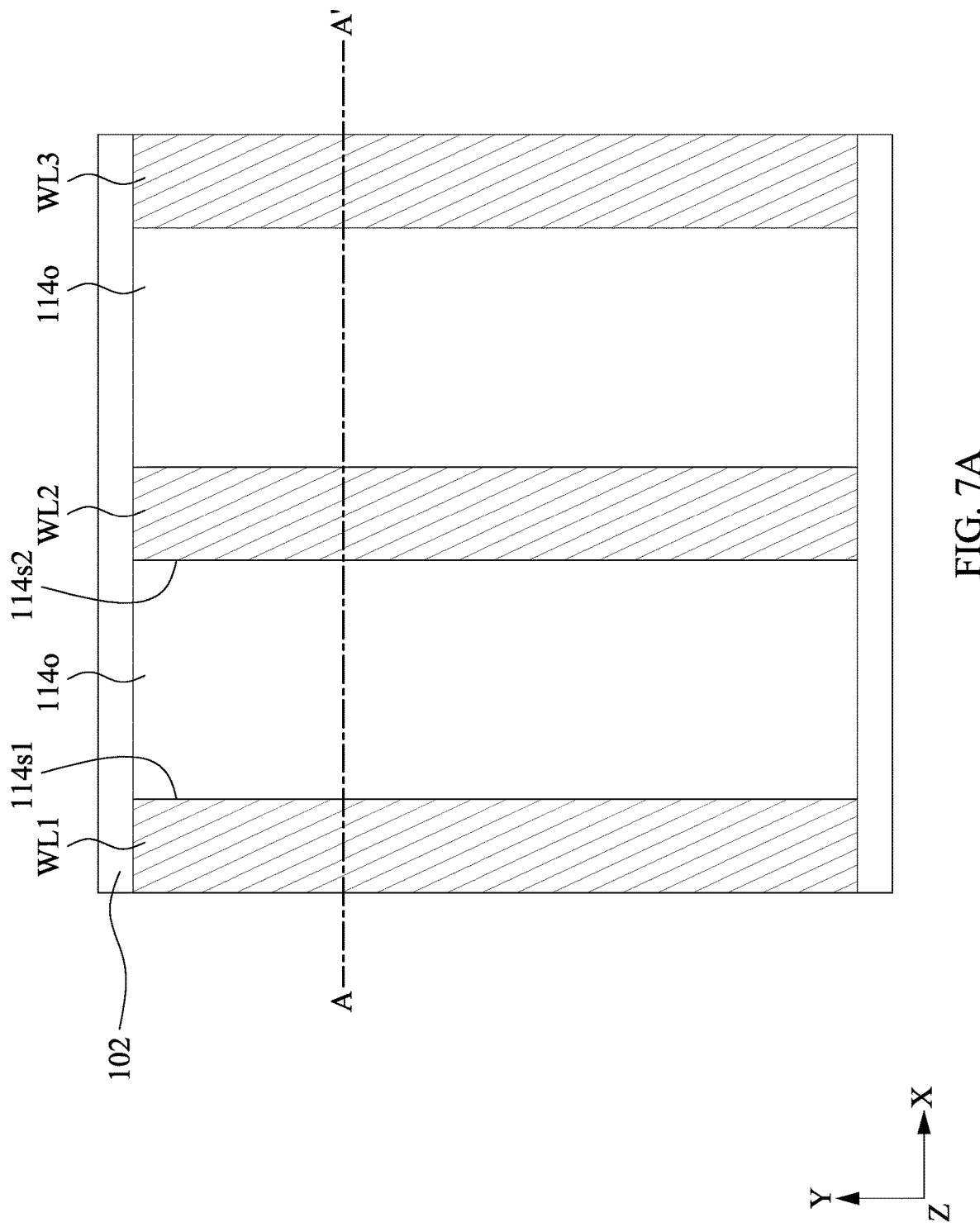

As shown in FIG. 7A and FIG. 7B, a patterning process can be performed to remove a portion of the dielectric layer 110, dielectric layer 112, and metallization layer 114. As a result, word lines WL1, WL2, and WL3 are formed. A plurality of openings 114o can be formed to expose an upper surface of the substrate 102. The patterning process can include a lithography process, an etching process and other suitable processes. The photolithography process may include photoresist coating (e.g., spin-on coating), soft baking, mask aligning, exposure, post-exposure baking, developing the photoresist, rinsing and drying (e.g., hard baking). The etching process can include, for example, a dry etching process or a wet etching process.

Figure 8A:
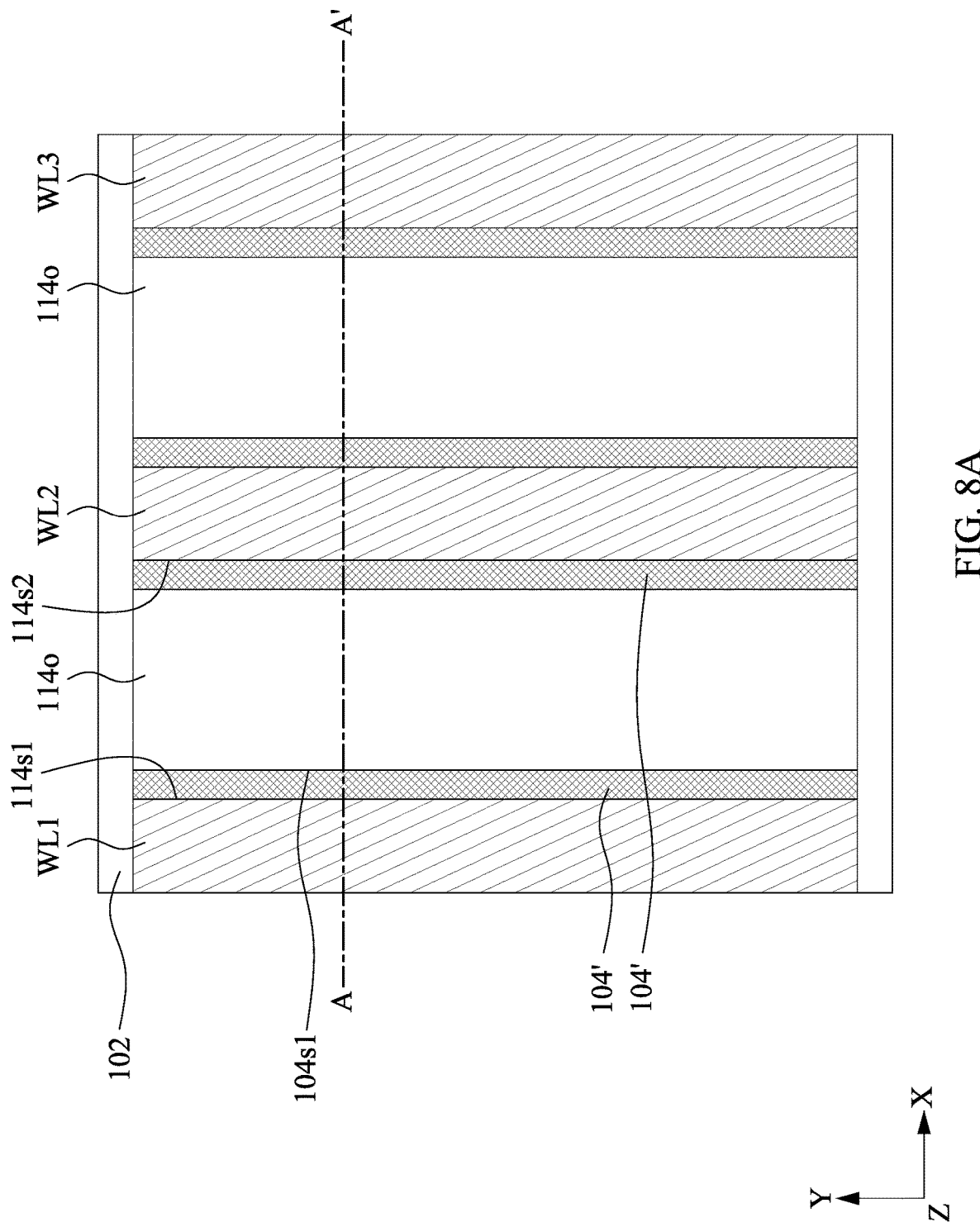
Figure 8B:
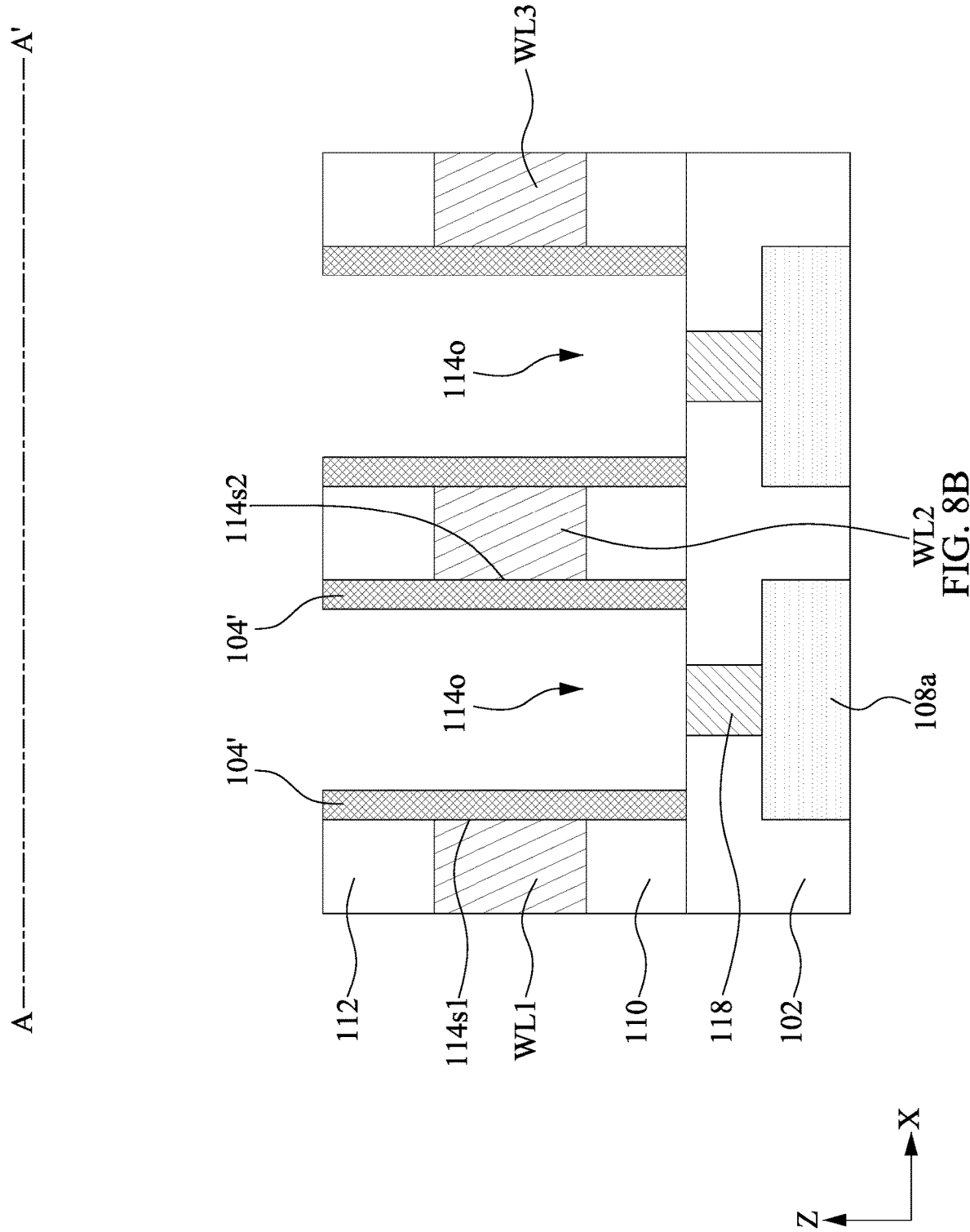

As shown in FIG. 8A and FIG. 8B, a dielectric material 104' can be conformally formed on sidewalls of the word lines WL1, WL2, and WL3. The dielectric material 104' can be formed on sidewalls of the dielectric layers 110 and 112. The dielectric material 104' can be in contact with the upper surface of the substrate 102. The dielectric material 104' can be formed by a deposition process, such as an ALD process.

Figure 9A:
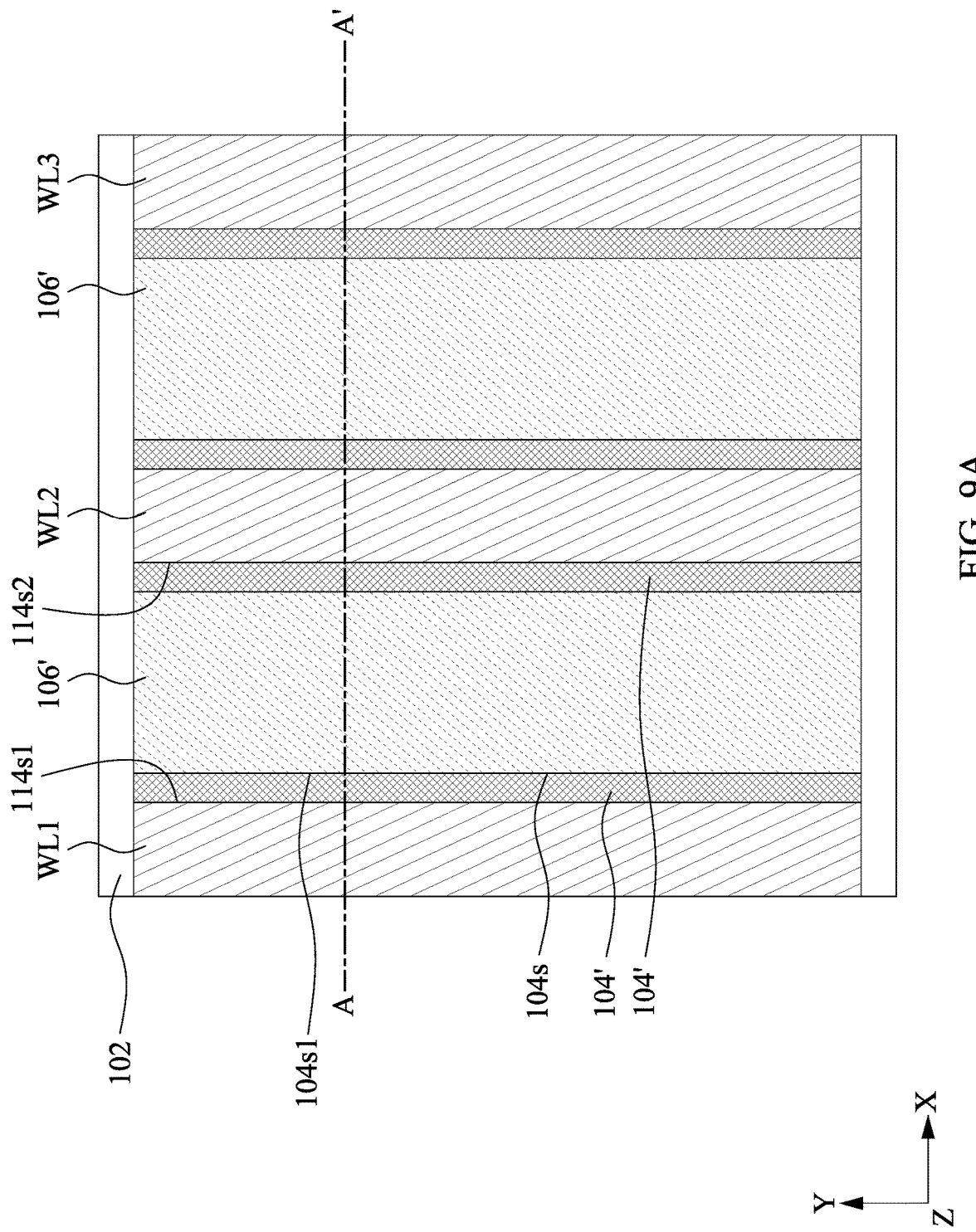

As shown in FIG. 9A and FIG. 9B, a semiconductor material 106' can be formed on the sidewall 104s of dielectric material 104'. The semiconductor material 106' can fill the openings 114o defined by the word lines WL1, WL2, and WL3. The semiconductor material 106' can be formed by CVD, ALD, PVD, LPCVD, or other suitable processes.

Figure 10A:
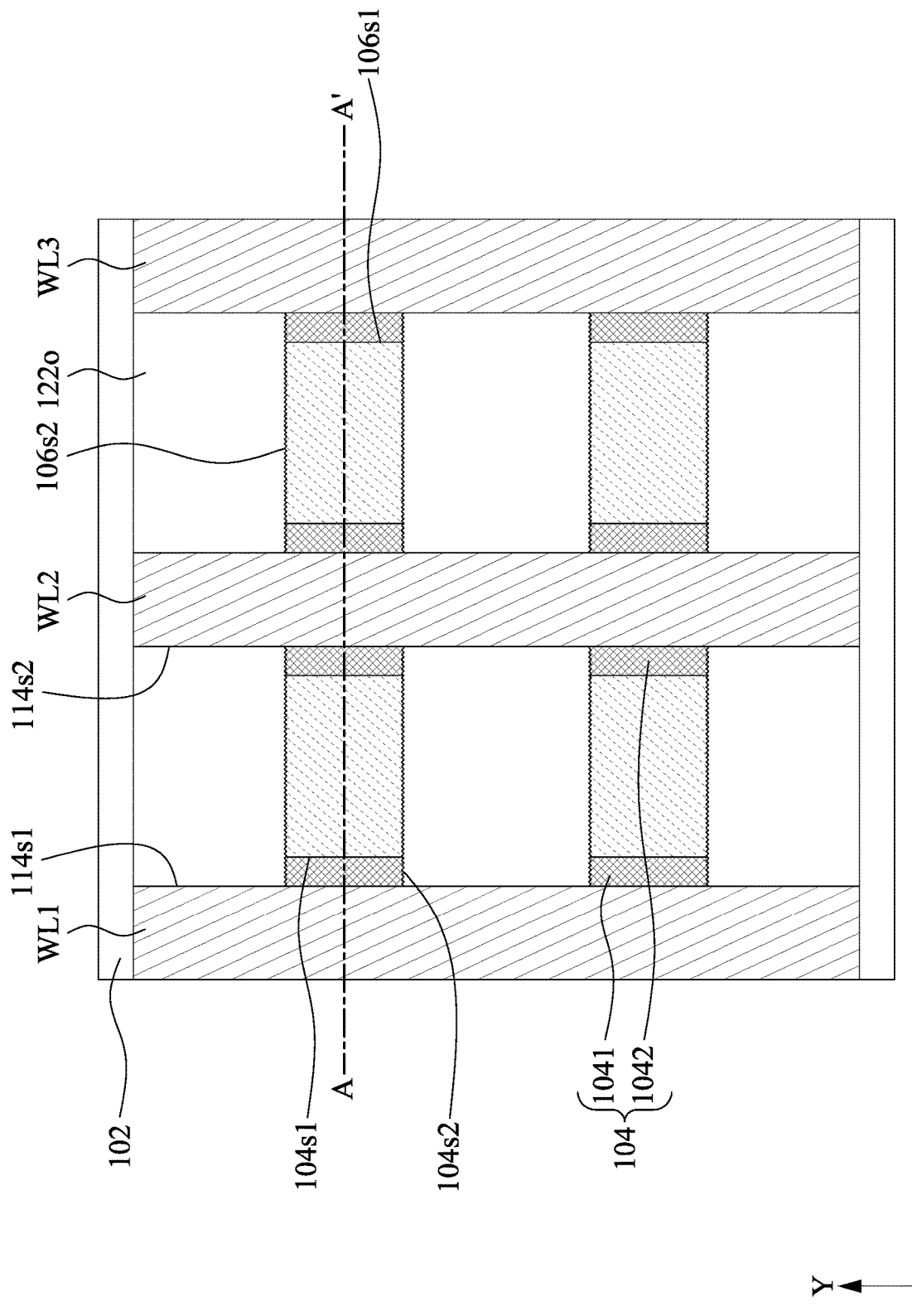
Figure 10B:
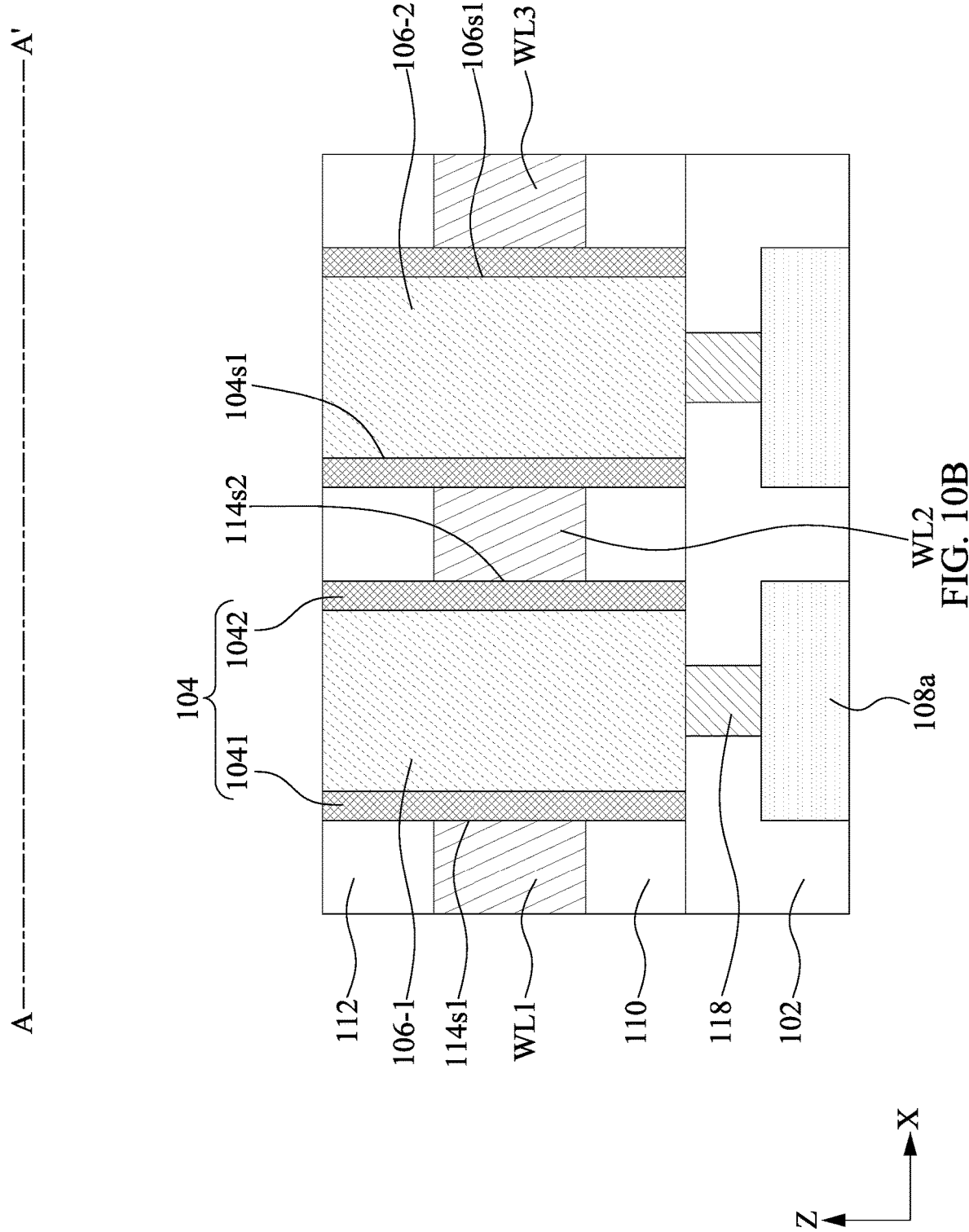

As shown in FIG. 10A and FIG. 10B, the dielectric material 104' and the semiconductor material 106' can be patterned, forming openings 122o between the word lines WL1, WL2, and WL3. A gate dielectric structure 104 can be formed. In some embodiments, the gate dielectric structure 104 can include a part 1041 and a part 1042 physically separated from the part 1041. The gate dielectric structure 104 can have a sidewall 104s1 and a sidewall 104s2 with different roughnesses. In some embodiments, the sidewall 104s2 can have a greater roughness due to the etching process. Channel layers 106-1 and 106-2 can be formed between the parts 1041 and 1042. The channel layer 106-1 or 106-2 can have a sidewall 106s1 and a sidewall 106s2 with different roughnesses. In some embodiments, the sidewall 106s2 can have a greater roughness due to the etching process. In some embodiments, each of the channel layers 106-1 and 106-2 can have a rectangular profile or a square profile. In some embodiments, the sidewall 106s2 of the channel layer 106-1 or 106-2 and the sidewall 104s2 of the gate dielectric structure 104 can be substantially coplanar.

Figure 11A:
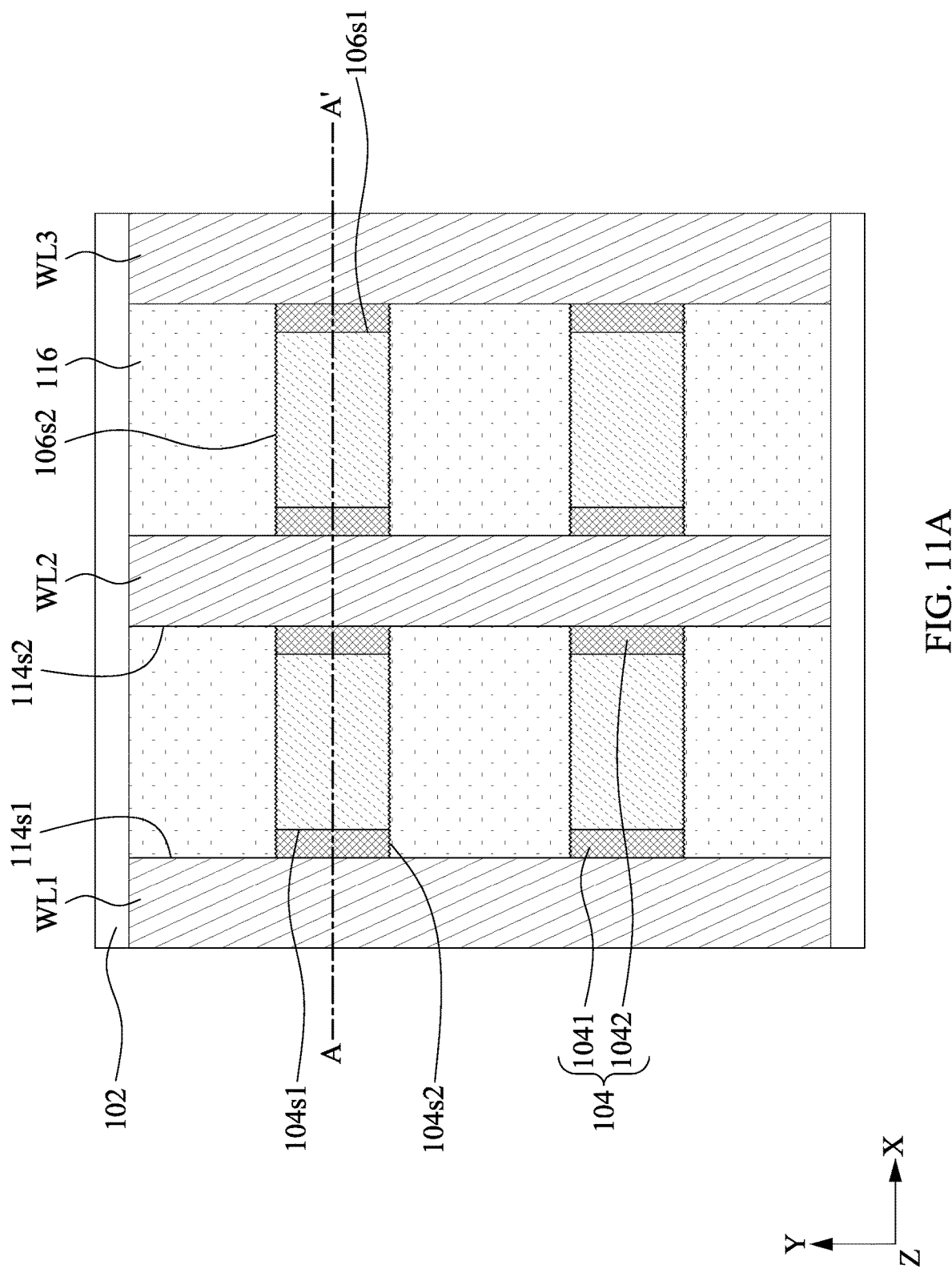
Figure 11B:
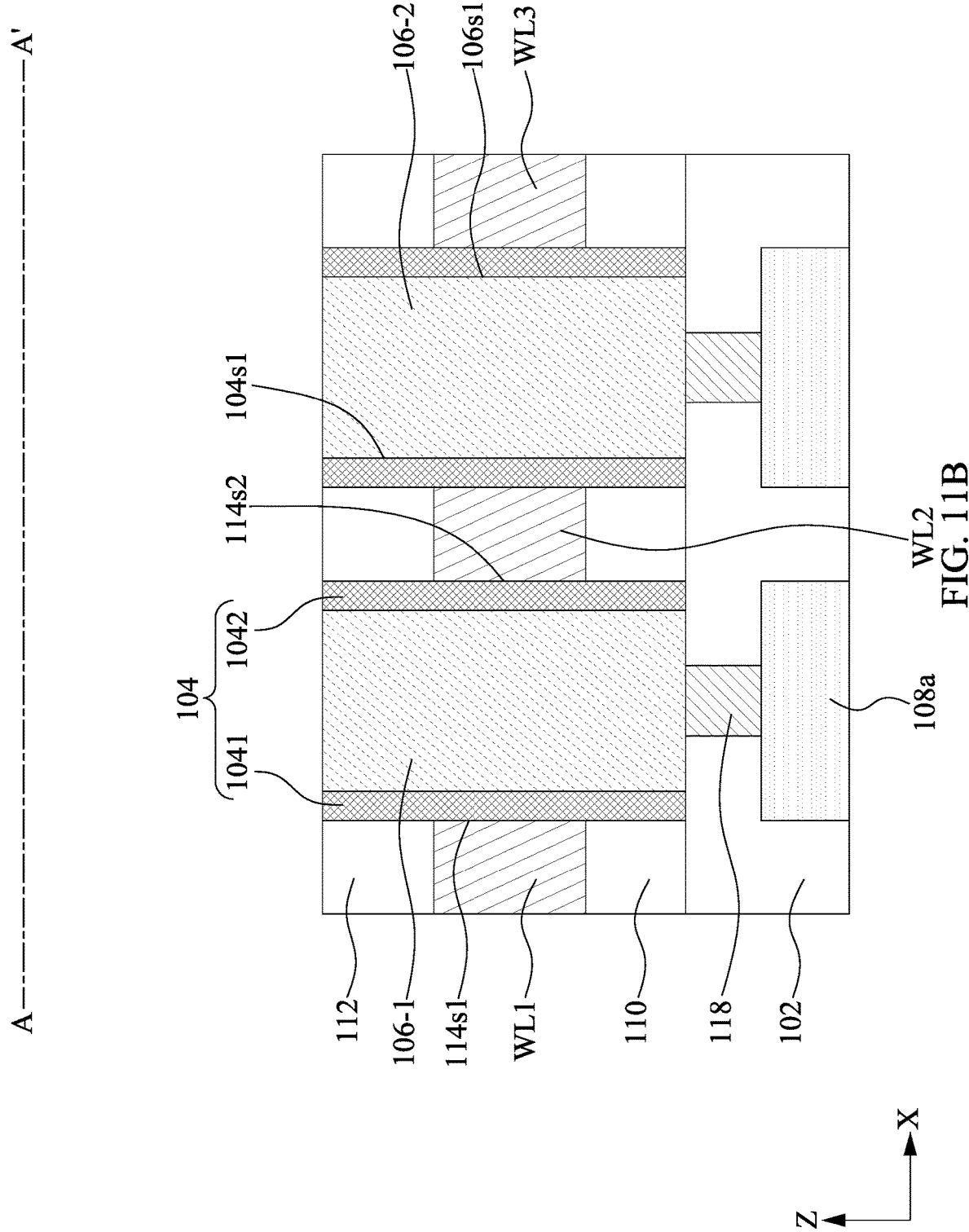

As shown in FIG. 11A and FIG. 11B, a dielectric layer 116 can be formed to fill the openings 122o. The dielectric layer 116 can be in contact with the sidewall 104s2 of the gate dielectric structure 104. The dielectric layer 116 can be in contact with the sidewall 106s2 of the channel layer 106-1 or 106-2. The dielectric layer 116 can be formed by CVD, ALD, PVD, LPCVD, or other suitable processes.

Figure 12A:
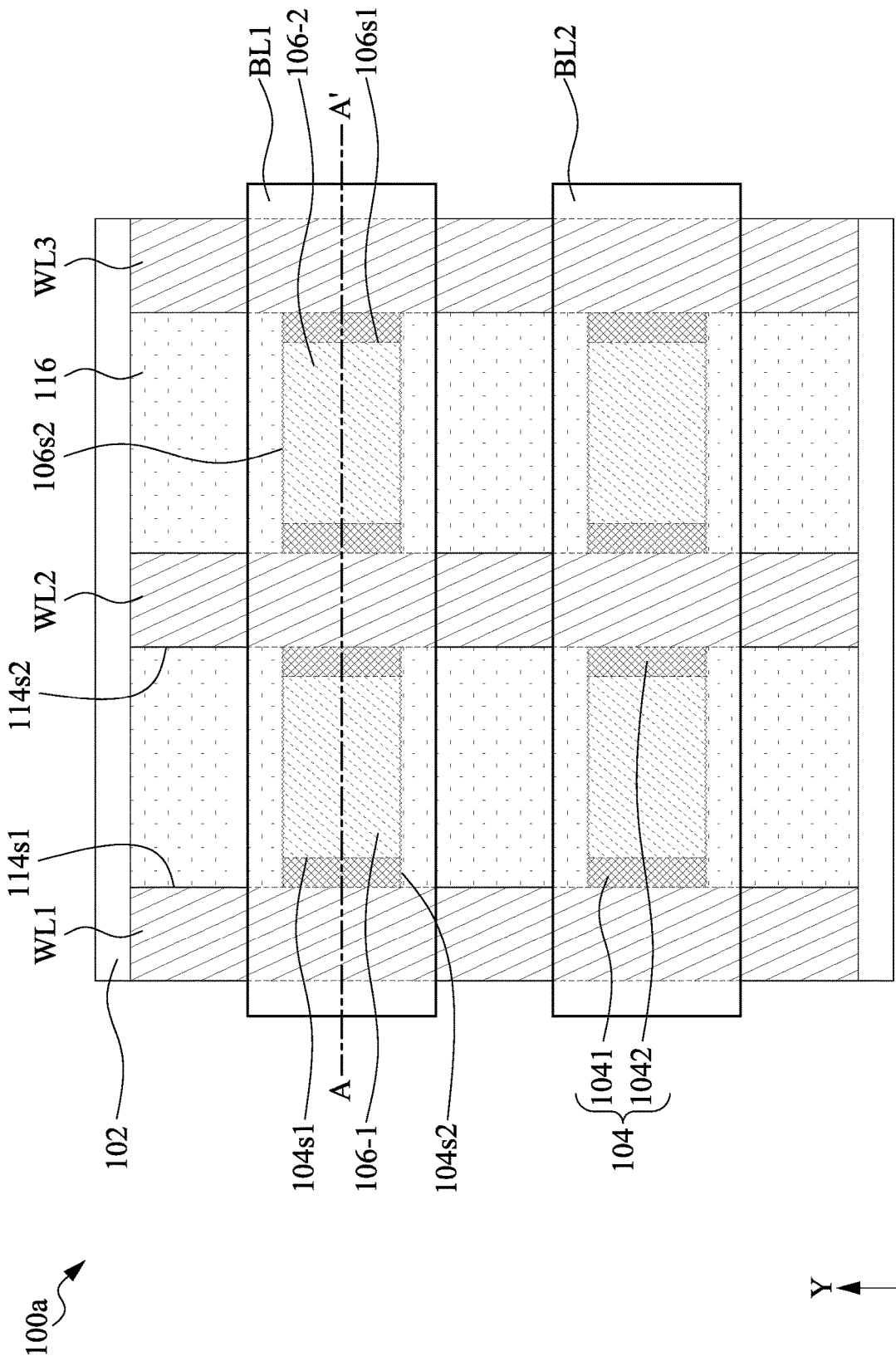
Figure 12B:
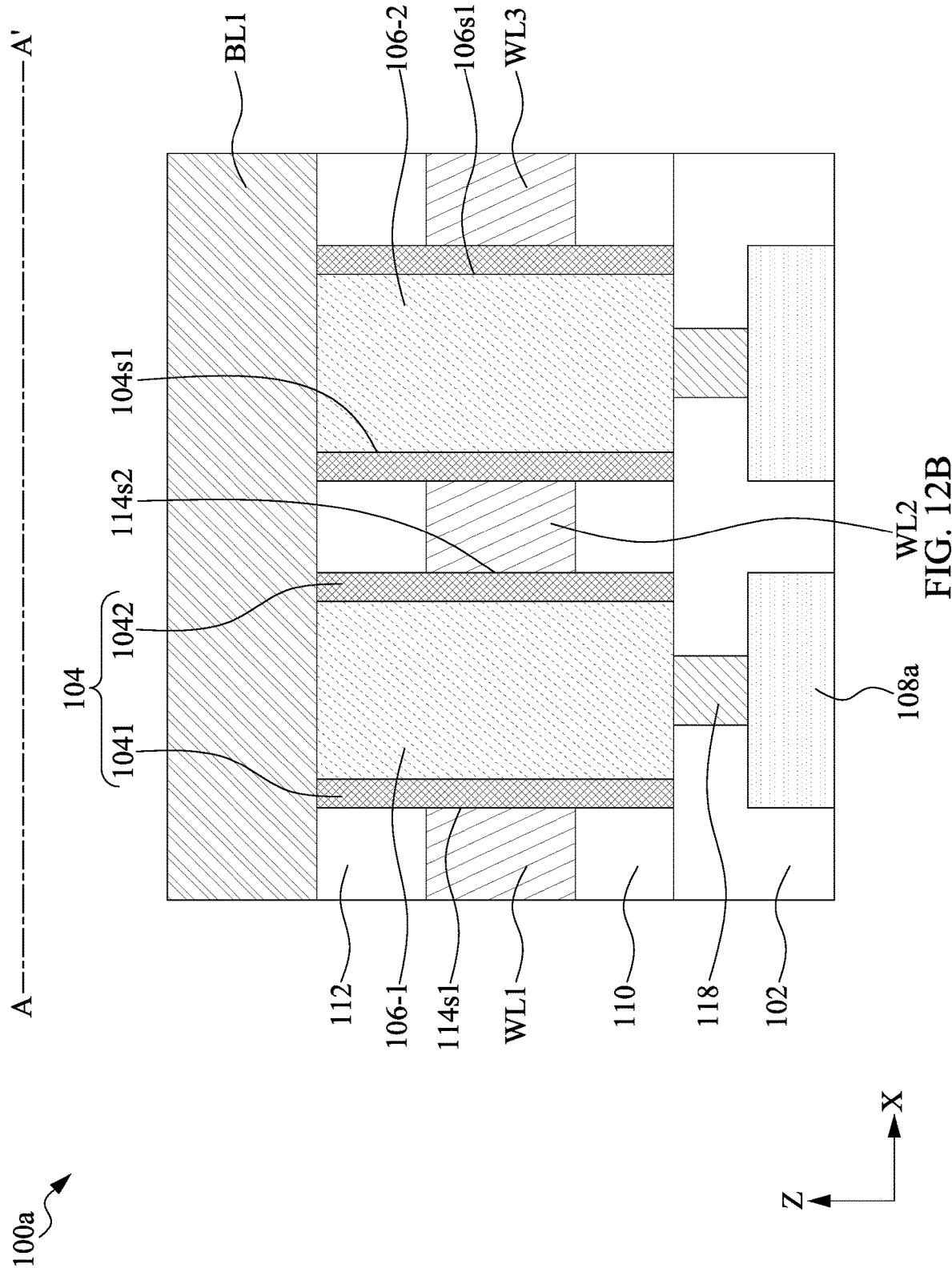

As shown in FIG. 12A and FIG. 12B, bit lines BL1 and BL2 can be formed on the dielectric layer 112, thereby forming the semiconductor device structure 100a. The bit lines BL1 and BL2 can be formed by sputtering, PVD, or other suitable processes.

As shown in FIGS. 6A-12A and FIGS. 6B-12B, each of the channel layers 106-1 and 106-2 is formed between two separated word lines. A lithography process to form an opening within a word line can be omitted. Further, the thickness of the gate dielectric structure 104, channel layers 106-1 and 106-2 can be adjusted more flexibly. Accordingly, the yield and performance of the semiconductor device structure 100a can be improved.

One aspect of the present disclosure provides a semiconductor device structure. The semiconductor device structure includes a first word line, a second word line, a gate dielectric structure, a channel layer, and a bit line. The first word line and second word line extend along a first direction. The gate dielectric structure is disposed on a first sidewall of the first word line and on a second sidewall of the second word line. The channel layer is disposed on a first sidewall of the gate dielectric structure. The bit line is disposed on the channel layer and extends along a second direction substantially perpendicular to the first direction. The channel layer has a first sidewall extending along the first direction and a second sidewall extending along the second direction. The first sidewall of the channel layer has a first roughness. The second sidewall of the channel layer has a second roughness different from the first roughness of the channel layer.

Another aspect of the present disclosure provides another semiconductor device structure. The semiconductor device structure includes a first word line, a second word line, a gate dielectric structure, a channel layer, and a bit line. The first word line extends along a first direction. The second word line is physically separated from the first word line and extends along the first direction. The gate dielectric structure is disposed between the first word line and the second word line. The channel layer is surrounded by the gate dielectric structure. The bit line is disposed on the channel layer and extends along a second direction substantially perpendicular to the first direction.

Another aspect of the present disclosure provides a method for manufacturing a semiconductor device structure. The method includes: providing a substrate; forming a first word line and a second word line extending along a first direction; forming a dielectric material conformally on a first sidewall of the first word line and on a second sidewall of the second word line, wherein the second sidewall of the second word line faces the first sidewall of the first word line; forming a semiconductor material on a sidewall of the dielectric material; and patterning the dielectric material and the semiconductor material to form a gate dielectric structure and a channel layer between the first word line and the second word line.

The embodiments of the present disclosure provide a semiconductor device structure with a channel layer with a rectangular profile or a square profile in a top view. The channel layer is disposed between two separated word lines. Thus, a lithography process performed on the word line, which is utilized to form an opening to be filled with the channel layer, can be omitted. Further, the thickness of the channel layer and the gate dielectric structure can be adjusted more flexibly. Accordingly, the yield and performance of a semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A semiconductor device structure, comprising:
    a first word line extending along a first direction;
    a second word line physically separated from the first word line and extending along the first direction;
    a gate dielectric structure disposed between the first word line and the second word line, wherein the gate dielectric structure has a first part disposed on a sidewall of the first word line and a second part disposed on a sidewall of the second word line, wherein the first part is physically separated from the second part;
    a channel layer sandwiched between the first part and the second part of the gate dielectric structure, wherein the channel layer has an exposed portion exposed from and is free from contacting with the gate dielectric structure between the first part and the second part;
    a bit line disposed on the channel layer and extending along a second direction substantially perpendicular to the first direction; and
    a substrate, wherein the first word line and the second word line define a recess tapered from the bit line toward the substrate, and the gate dielectric structure is disposed within the recess.

2. The semiconductor device structure of claim 1, wherein the channel layer has a first sidewall extending along the first direction and a second sidewall extending along the second direction, the first sidewall of the channel layer has a first roughness, and the second sidewall of the channel layer has a second roughness different from the first roughness of the channel layer, wherein the second sidewall of the channel layer is exposed from and is free from contacting with the gate dielectric structure.

3. The semiconductor device structure of claim 1, wherein the channel layer has a first length along the first direction and a second length along the second direction, the first length is smaller than the second length, and the first word line has a third length along the second direction, and the second length is greater than the third length.

4. The semiconductor device structure of claim 1, wherein the channel layer has a first sidewall extending along the first direction and a second sidewall extending along the second direction, and the second sidewall of the channel layer is free from overlapping the gate dielectric structure along the first direction.

5. The semiconductor device structure of claim 1, wherein the channel layer has a first sidewall extending along the first direction and a second sidewall extending along the second direction, and the second sidewall of the channel layer is free from overlapping the first word line along the first direction.

6. The semiconductor device structure of claim 1, further comprising:
    a dielectric layer disposed between the first word line and the second word line, wherein the gate dielectric structure and the channel layer are in contact with the dielectric layer.

7. The semiconductor device structure of claim 1, further comprising:
    a dielectric layer disposed between the first word line and the second word line, wherein the exposed portion of the channel layer is in contact with the dielectric layer.

8. The semiconductor device structure of claim 1, further comprising:
    a capacitor structure disposed within the substrate, wherein the capacitor structure is free from overlapping the first word line along a third direction substantially perpendicular to the first direction and the second direction; and
    a contact plug disposed within the substrate, wherein the contact plug is disposed between the capacitor structure and the channel layer.

9. The semiconductor device structure of claim 8, wherein the capacitor structure is free from overlapping the gate dielectric structure along the third direction.

* * * * *